United States Patent
Whetsel

(10) Patent No.: US 9,612,282 B2
(45) Date of Patent: Apr. 4, 2017

(54) ADDRESSABLE TAP WITH ADDRESS DETECT AND CONTROL. AND GATING CIRCUITRY

(71) Applicant: Texas Instruments Incorporated, Dallas, TX (US)

(72) Inventor: Lee D. Whetsel, Parker, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 14/934,437

(22) Filed: Nov. 6, 2015

(65) Prior Publication Data

US 2016/0061893 A1 Mar. 3, 2016

Related U.S. Application Data

(62) Division of application No. 14/605,728, filed on Jan. 26, 2015, now Pat. No. 9,213,062, which is a division of application No. 13/953,250, filed on Jul. 29, 2013, now Pat. No. 8,984,358, which is a division of application No. 13/614,615, filed on Sep. 13, 2012, now Pat. No. 8,522,095, which is a division of application No. 13/427,270, filed on Mar. 22, 2012, now abandoned, which is a division of application No. 12/970,097, filed on Dec. 16, 2010, now Pat. No. 8,166,358, which is a division of application No. 12/116,496, filed on May 7, 2008, now Pat. No. 7,877,653.

(Continued)

(51) Int. Cl.
*G01R 31/3177* (2006.01)
*G01R 31/3185* (2006.01)

(52) U.S. Cl.
CPC .. *G01R 31/3177* (2013.01); *G01R 31/318555* (2013.01); *G01R 31/318572* (2013.01)

(58) Field of Classification Search
CPC .... G01R 31/318555; G01R 31/318572; G01R 31/3177; G01R 31/318544; G01R 31/318558; G06F 11/267
USPC ......................................................... 714/727
See application file for complete search history.

(56) References Cited

U.S. PATENT DOCUMENTS 5,483,518 A * 1/1996 Whetsel ............. G01R 31/2815
324/73.1
5,497,379 A * 3/1996 Whetsel ......... G01R 31/318558
324/762.02

(Continued)

OTHER PUBLICATIONS

Whetsel, L.;, "Addressable test ports an approach to testing embedded cores," Test Conference, 1999. Proceedings. International, vol., No., pp. 1055-1064, 1999.*

(Continued)

*Primary Examiner* — Cynthia Britt
(74) *Attorney, Agent, or Firm* — Lawrence J. Bassuk; Charles A. Brill; Frank D. Cimino

(57) ABSTRACT

The disclosure provides a novel method and apparatus for inputting addresses to devices to select the device TAP for access. Further, the disclosure provides a novel method and apparatus for inputting addresses for selecting device TAPs and for inputting commands for commanding circuitry within the device. The inputting of addresses or the inputting of addresses and commands is initiated by a control bit input on TDI that is recognized during the Run Test/Idle, Pause-DR or Pause-IR TAP states.

4 Claims, 25 Drawing Sheets

Related U.S. Application Data

(60) Provisional application No. 60/917,002, filed on May 9, 2007.

(56) References Cited

U.S. PATENT DOCUMENTS

| | | | | |
|---|---|---|---|---|
| 6,418,545 | B1* | 7/2002 | Adusumilli | G01R 31/318555 714/729 |
| 6,760,874 | B2* | 7/2004 | Cote | G01R 31/31724 714/724 |
| 7,627,794 | B2* | 12/2009 | Kinter | G01R 31/31723 714/724 |
| 7,877,653 | B2* | 1/2011 | Whetsel | G01R 31/318555 714/727 |
| 2002/0035658 | A1* | 3/2002 | Whetsel | G01R 31/2815 710/300 |
| 2006/0156112 | A1* | 7/2006 | Whetsel | G01R 31/31712 714/724 |

OTHER PUBLICATIONS

Benabdenbi, M.; Maroufi, W.; Marzouki, M.;, "Testing TAPed cores and wrapped cores with the same test access mechanism," Design, Automation and Test in Europe, 2001. Conference and Exhibition 2001. Proceedings, vol., No., pp. 150-155, 2001.*

* cited by examiner

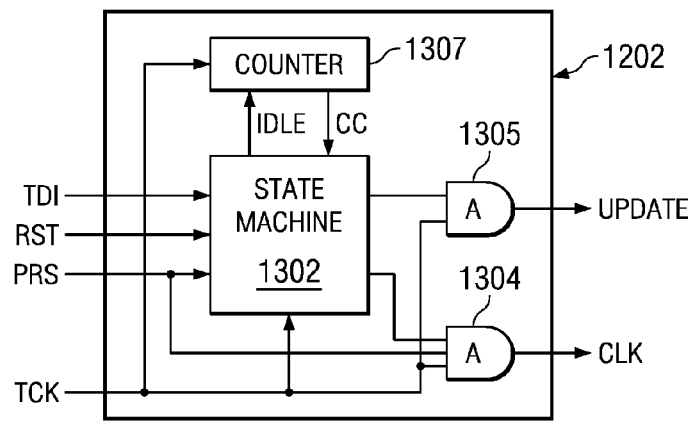
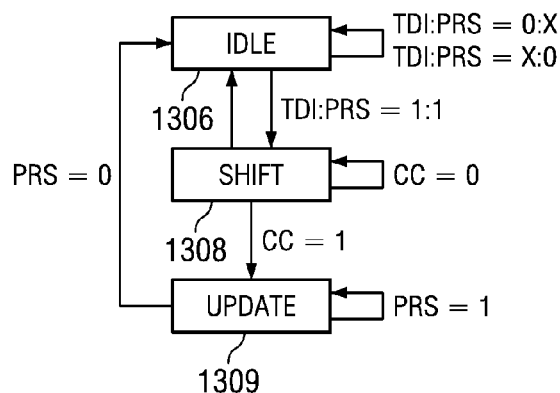
FIG. 13
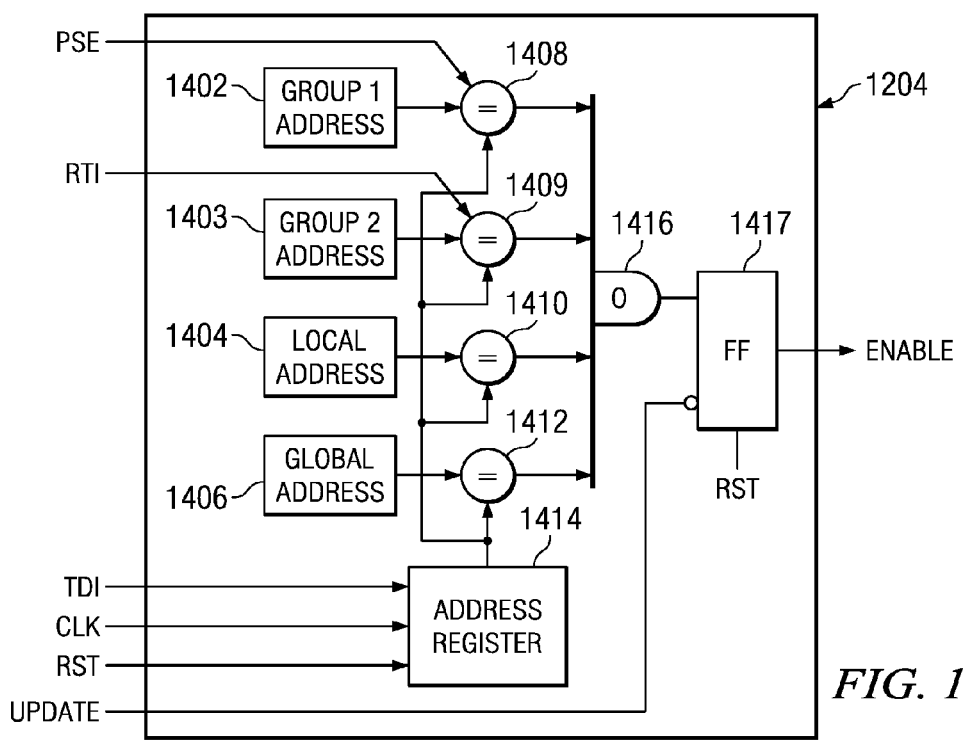
FIG. 14A

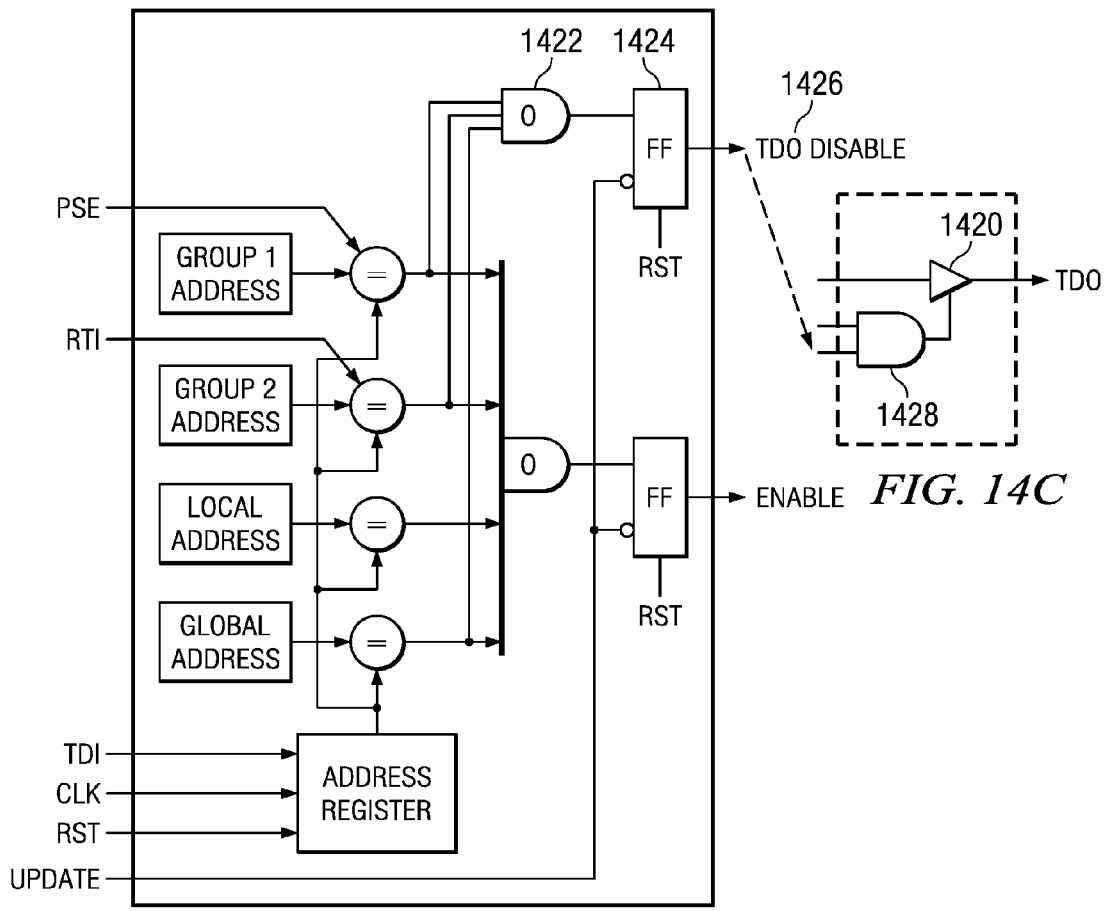
*FIG. 14B*
*FIG. 14C*
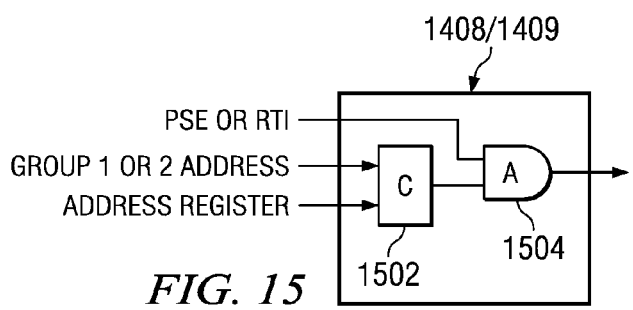
*FIG. 15*
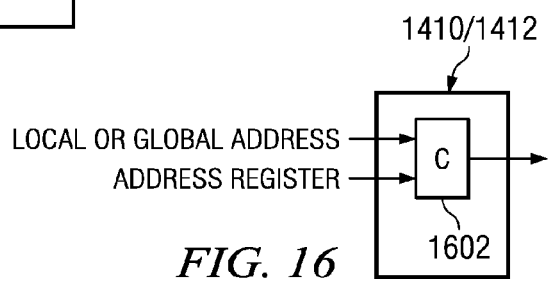
*FIG. 16*

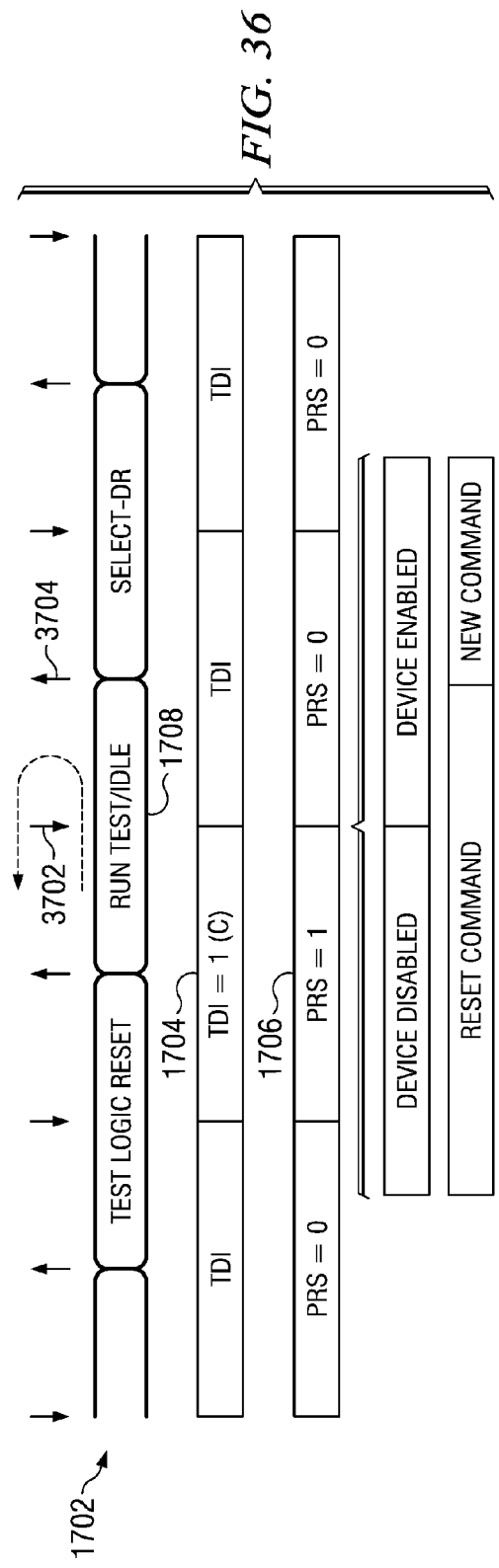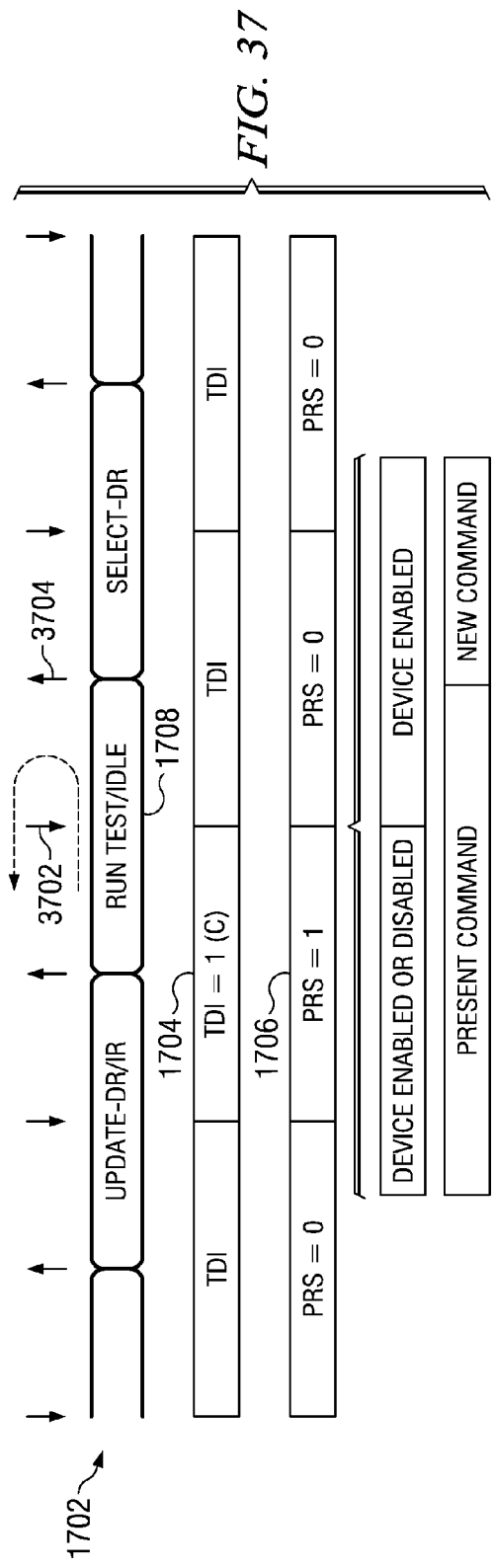

ADDRESSABLE TAP WITH ADDRESS DETECT AND CONTROL. AND GATING CIRCUITRY

This application is a divisional of prior application Ser. No. 14/605,728, filed Jan. 26, 2015, currently pending;

Which was a divisional of prior application Ser. No. 13/953,250, filed Jul. 29, 2013, now U.S. Pat. No. 8,984,358, granted Mar. 17, 2015;

Which was a divisional of prior application Ser. No. 13/614,615, filed Sep. 13, 2012; now U.S. Pat. No. 8,522,095, granted Aug. 27, 2013;

Which was a divisional of prior application Ser. No. 13/427,270, filed Mar. 22, 2012, now abandoned;

Which was a divisional of prior application Ser. No. 12/970,097, filed Dec. 16, 2010, now U.S. Pat. No. 8,166,358, granted Apr. 24, 2012;

Which was a divisional of prior application Ser. No. 12/116,496, filed May 7, 2008, now U.S. Pat. No. 7,877,653, granted Jan. 25, 2011;

And claims priority under 35 USC 119(e)(1) of Provisional Application No. 60/917,002, filed May 9, 2007.

FIELD OF THE DISCLOSURE

This disclosure relates in general to devices using Test Access Ports and in particular to devices using Test Access Ports that can be addressed and commanded.

DESCRIPTION OF RELATED ART

Most electrical devices today, which may be boards, ICs or embedded cores within ICs, use the IEEE 1149.1 standard TAP and interface (referred to hereafter as JTAG TAP interface) to perform a variety of necessary operations, including but not limited to hardware test operations, hardware diagnostic operations, hardware/software debug operations, software trace operations and hardware programming operations. A number of additional IEEE standards have been created that also utilize the JTAG TAP interface to perform standardized operations beyond what the original JTAG TAP standard was designed to perform. Some of these additional IEEE standards include 1149.4, 1149.6, 1149.7, 1532, 1581, 1687, and 1500. The JTAG TAP interface of a device includes a test data input (TDI) terminal, a test clock (TCK) terminal, a test mode select (TMS) terminal, a test data output (TDO) terminal, and optionally a test reset (TRST) terminal. These device TAP interface terminals are dedicated and thus are available for enabling the above mentioned device operations at any point in the device's lifetime, i.e. device manufacturing through device system application.

FIG. 1 illustrates an 1149.1 TAP controller interfaced to a device's 1149.1 TAP via TDI, TCK, TMS, and TDO signals to allow the TAP controller to access the device TAP's instruction register (IR) and data registers (DR). An optional TRST signal may be used if desired between the TAP controller and device TAP for resetting the TAP. However, for simplification the optional TRST signal is not shown between the TAP controller and device TAP. This interface configuration is well known.

FIG. 2 illustrates the state diagram of the IEEE standard 1149.1 TAP. As seen, the logic level on the TMS signal, during each rising edge of TCK, causes transitions in the state diagram. This state diagram is well known.

FIG. 3 illustrates a TAP controller interfaced to a number of device TAPs configured into a Daisy-Chain arrangement. This interface configuration is well known.

FIG. 4 illustrates a TAP controller interfaced to a number of device TAPs configured in a Star arrangement. As seen, this interface uses a unique TMS signal from the TAP controller to enable access of each device TAP. Having a unique TMS signal for each device TAP increases the wiring between the TAP controller and device TAPs. This interface configuration is well known.

FIG. 5 illustrates a TAP controller interfaced to a number of device TAPs configured in a Star arrangement. As seen, this interface uses a unique TCK signal from the TAP controller to enable access of each device TAP. Having a unique TCK signal for each device TAP increases the wiring between the TAP controller and device TAPs. This interface configuration is well known.

FIG. 6 illustrates device TAP state transition sequences 602-610. These TAP state sequences are provided to illustrate the value of the TDI input to the device TAP. These state transitions are defined by the TAP state diagram of FIG. 2. The rising and falling edges of TCK 600 are shown above the TAP state transitions 602-610.

In sequence 602 the device TAP is seen transitioning from the Test Logic Reset state to the Run Test/Idle state then to the Select-DR state. As seen, the device TAP will remain in the Run Test/Idle state if the TMS input is held at a logic zero. Since data is not input during these state transitions, the value of the TDI input to the device is a don't care (X).

In sequence 604 the device TAP is seen transitioning from the Update-DR state to the Run Test/Idle state then to the Select-DR state. As seen, the device TAP will remain in the Run Test/Idle state if the TMS input is held at a logic zero. Since data is not input during these state transitions, the value of the TDI input to the device is a don't care (X).

In sequence 606 the device TAP is seen transitioning from the Update-IR state to the Run Test/Idle state then to the Select-DR state. As seen, the device TAP will remain in the Run Test/Idle state if the TMS input is held at a logic zero. Since data is not input during these state transitions, the value of the TDI input to the device is a don't care (X).

In sequence 608 the device TAP is seen transitioning from the Exit1-DR state to the Pause-DR state then to the Exit2-DR state. The state preceding the Exit1-DR state is the Shift-DR state (see FIG. 2) and in the Shift-DR state TDI is set to the last data bit value (D) to be shifted into the TAP's selected data register. As seen, the device TAP will remain in the Pause-DR state if the TMS input is held at a logic zero. Since data is not input during these state transitions, the value of the TDI input to the device is a don't care (X).

In sequence 610 the device TAP is seen transitioning from the Exit1-IR state to the Pause-IR state then to the Exit2-IR state. The state preceding the Exit1-IR state is the Shift-IR state (see FIG. 2) and in the Shift-IR state TDI is set to the last data bit value (D) to be shifted into the TAP's instruction register. As seen, the device TAP will remain in the Pause-IR state if the TMS input is held at a logic zero. Since data is not input during these state transitions, the value of the TDI input to the device is a don't care (X).

SUMMARY OF THE DISCLOSURE

This disclosure provides a novel method and apparatus for using a control bit on TDI upon entry into Run Test/Idle, Pause-DR or Pause-IR to allow inputting an address or inputting an address and a command to a device via TDI. The address is used for selecting the device's TAP for access and the command is used for commanding an operation within the device. The device may be a board of ICs, an IC, or an embedded core within an IC.

DESCRIPTION OF THE VIEWS OF THE DISCLOSURE

FIG. 13 illustrates an example implementation of an Address Controller circuit used in the Address Circuit of FIG. 12.

FIG. 14A illustrates an example implementation of an Address Detect Circuit used in the Address Circuit of FIG. 12.

FIGS. 14B and 14C illustrate an example implementation of a TDO controlling Address Detect Circuit used in the Address Circuit of FIG. 12.

FIG. 15 illustrates an example implementation of a first type of address comparator circuit used in the Address Detect Circuit of FIG. 14.

FIG. 16 illustrates an example implementation of a second type of address comparator circuit used in the Address Detect Circuit of FIG. 14.

FIG. 36 illustrates a first example of inputting an address and a command during the Run Test/Idle state.

FIG. 37 illustrates a second example of inputting an address and command during the Run Test/Idle state.

DETAILED DESCRIPTION

Figure 6:
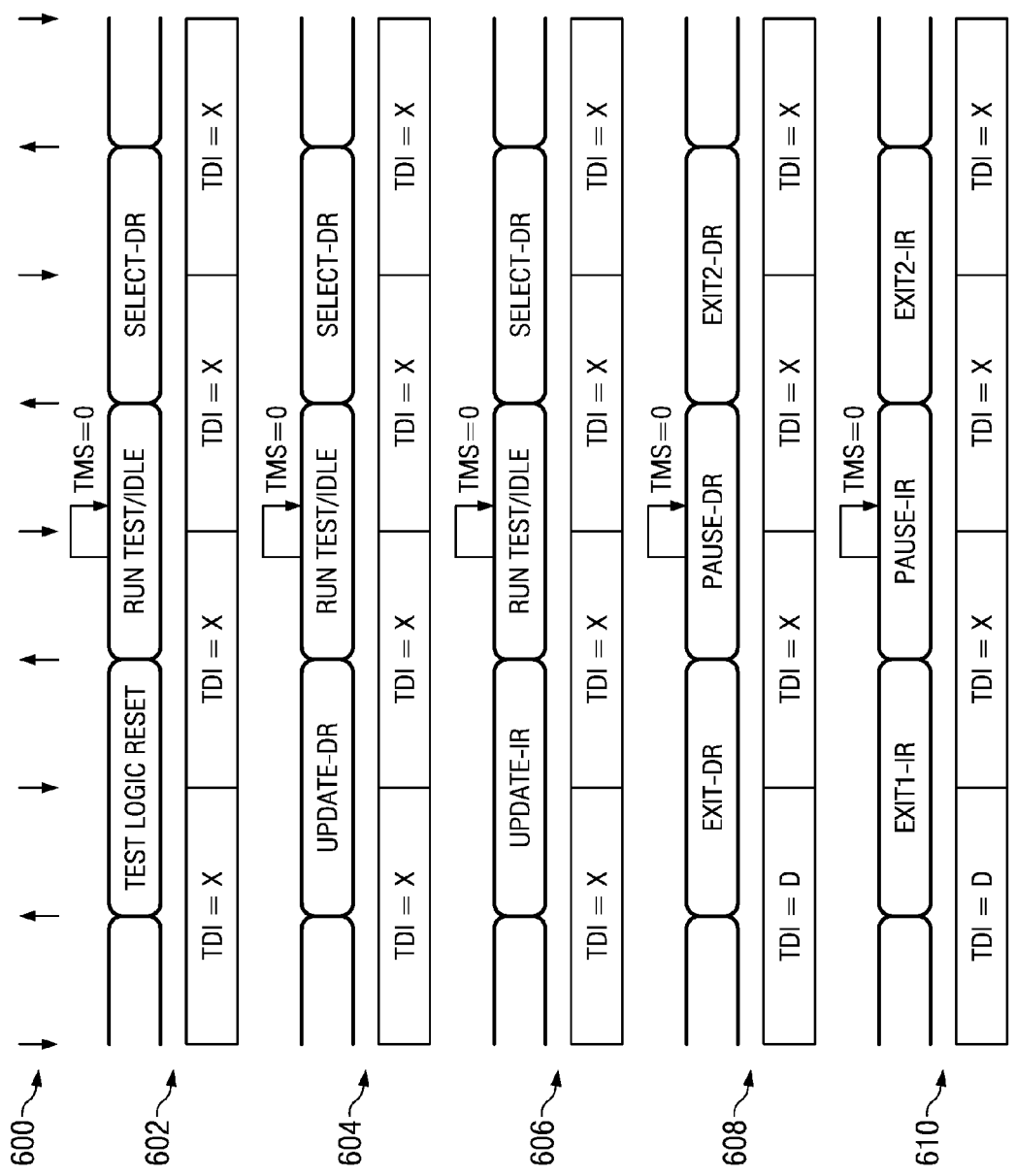
FIG. 6 illustrate 1149.1 TAP state transition examples.
Figure 7:
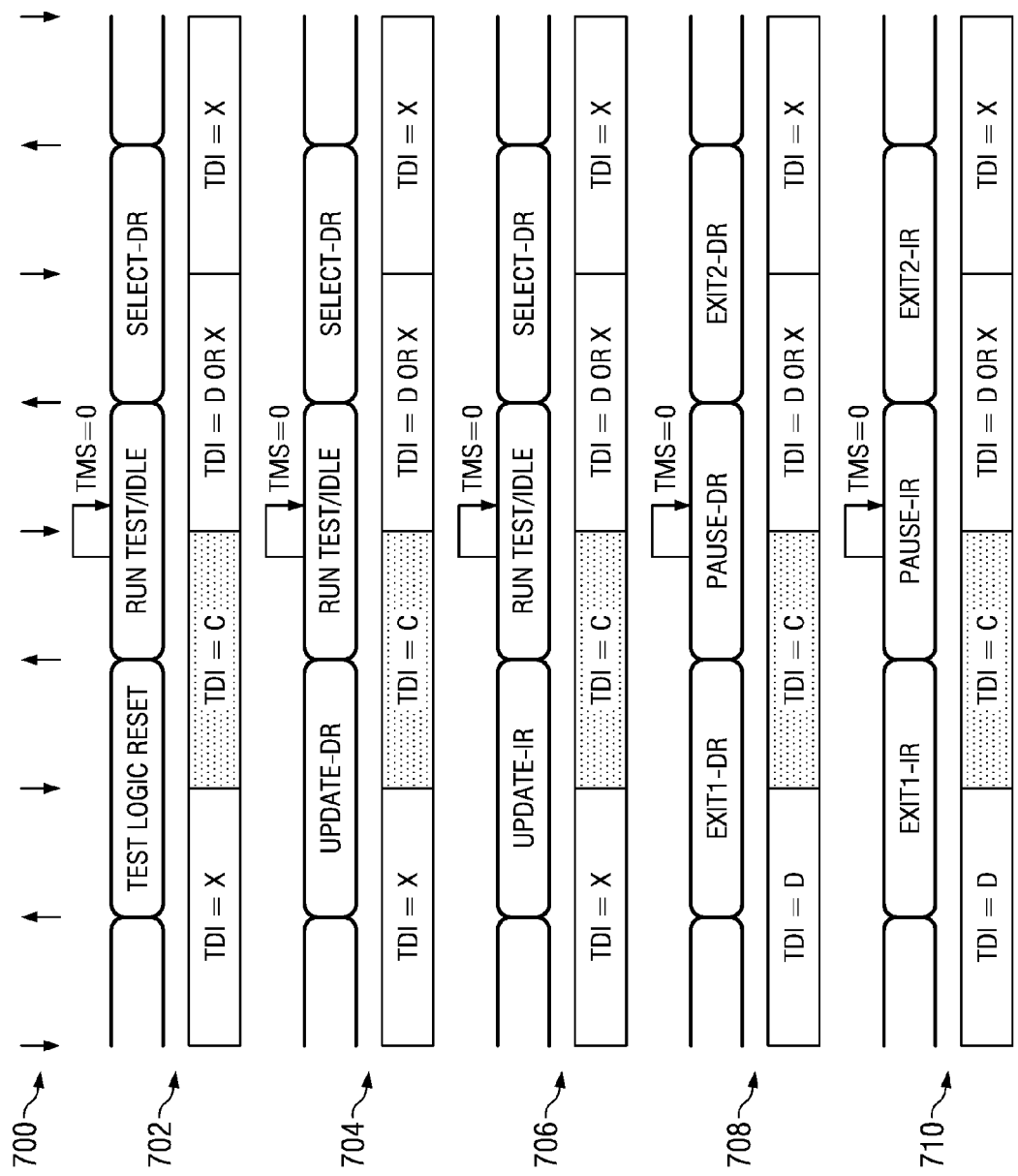
FIG. 7 illustrates TAP state transition examples using TDI control signals according to the disclosure.

FIG. 7 illustrates device TAP state transition sequences 702-710. The state sequences 702-710 are similar to state sequence 602-610 of FIG. 6 with the exception that they have been modified, as will be described below, to enable the TAP addressing capabilities of the present disclosure. These TAP state sequences 702-710 illustrate how the present disclosure modifies the TDI input to the device TAPs during the state transitions to enable TDI to be used to input an address to select or deselect a device TAP. The rising and falling edges of TCK 700 are shown above the TAP state transitions 702-710.

In sequence 702 the device TAP is seen transitioning from the Test Logic Reset state to the Run Test/Idle state then to the Select-DR state. As seen, the device TAP will remain in the Run Test/Idle state if the TMS input is held at a logic zero. As seen and according to the present disclosure, the value of TDI upon entry to the Run Test/Idle state is no longer a don't care (X) signal as in sequence 602, but rather is defined as a control (C) signal. The control (C) signal is used to indicate whether data (D) or don't care (X) values are input to the device on subsequent TDI inputs during the Run Test/Idle state. If the control (C) signal is set low, TDI inputs don't care (X) values during the Run Test/Idle state as shown in sequence 602. However, if the control (C) signal is set high, TDI inputs data (D) values during the Run Test/Idle state as shown in sequence 702. The TDI data (D) values input during the Run Test/Idle state are used to input an address to addressing circuitry within the device to either select or deselect the device's TAP. The addressing circuitry of the present disclosure will be described later.

In sequence 704 the device TAP is seen transitioning from the Update-DR state to the Run Test/Idle state then to the Select-DR state. As seen, the device TAP will remain in the Run Test/Idle state if the TMS input is held at a logic zero. As mentioned in sequence 702, the value of TDI upon entry to the Run Test/Idle state is defined to be a control (C) signal that indicates whether address data (D) or don't care (X) values are input to the device on subsequent TDI inputs during the Run Test/Idle state. Also as mentioned in sequence 702, TDI data (D) values input during the Run Test/Idle state are used to input an address to addressing circuitry within the device to either select or deselect the device's TAP.

In sequence 706 the device TAP is seen transitioning from the Update-IR state to the Run Test/Idle state then to the Select-DR state. As seen, the device TAP will remain in the Run Test/Idle state if the TMS input is held at a logic zero. As mentioned in sequence 702, the value of TDI upon entry to the Run Test/Idle state is defined to be a control (C) signal that indicates whether address data (D) or don't care (X) values are input to the device on subsequent TDI inputs during the Run Test/Idle state. Also as mentioned in sequence 702, TDI data (D) values input during the Run Test/Idle state are used to input an address to addressing circuitry within the device to either select or deselect the device's TAP.

In sequence 708 the device TAP is seen transitioning from the Exit1-DR state to the Pause-DR state then to the Exit2-DR state. As seen, the device TAP will remain in the Pause-DR state if the TMS input is held at a logic zero. The value of TDI upon entry to the Pause-DR state is defined to be a control (C) signal that indicates whether address data (D) or don't care (X) values are input to the device on subsequent TDI inputs during the Pause-DR state. If the control (C) signal is set low, TDI inputs don't care (X) values during the Pause-DR state as shown in sequence 608. However, if the control (C) signal is set high, TDI inputs data (D) values during the Pause-DR state as shown in sequence 708. The TDI data (D) values input during the Pause-DR state are used to input an address to addressing circuitry within the device to either select or deselect the device's TAP.

In sequence 710 the device TAP is seen transitioning from the Exit1-IR state to the Pause-IR state then to the Exit2-IR state. As seen, the device TAP will remain in the Pause-IR state if the TMS input is held at a logic zero. The value of TDI upon entry to the Pause-IR state is defined to be a control (C) signal that indicates whether address data (D) or don't care (X) values are input to the device on subsequent TDI inputs during the Pause-IR state. If the control (C) signal is set low, TDI inputs don't care (X) values during the Pause-DR state as shown in sequence 610. However, if the control (C) signal is set high, TDI inputs data (D) values during the Pause-IR state as shown in sequence 710. The TDI data (D) values input during the Pause-IR state are used to input an address to addressing circuitry within the device to either select or deselect the device's TAP.

It should be understood that the above mentioned control (C) signal logic levels could be reversed if desired to where a logic low on the control (C) signal indicates the input of data (D) values on TDI and a logic high on the control (C) signal indicates the input of don't care (X) values on TDI during the Run Test/Idle, Pause-DR, and Pause-IR states. This is true for other signals in this disclosure where signal logic levels are mentioned.

Figure 4:
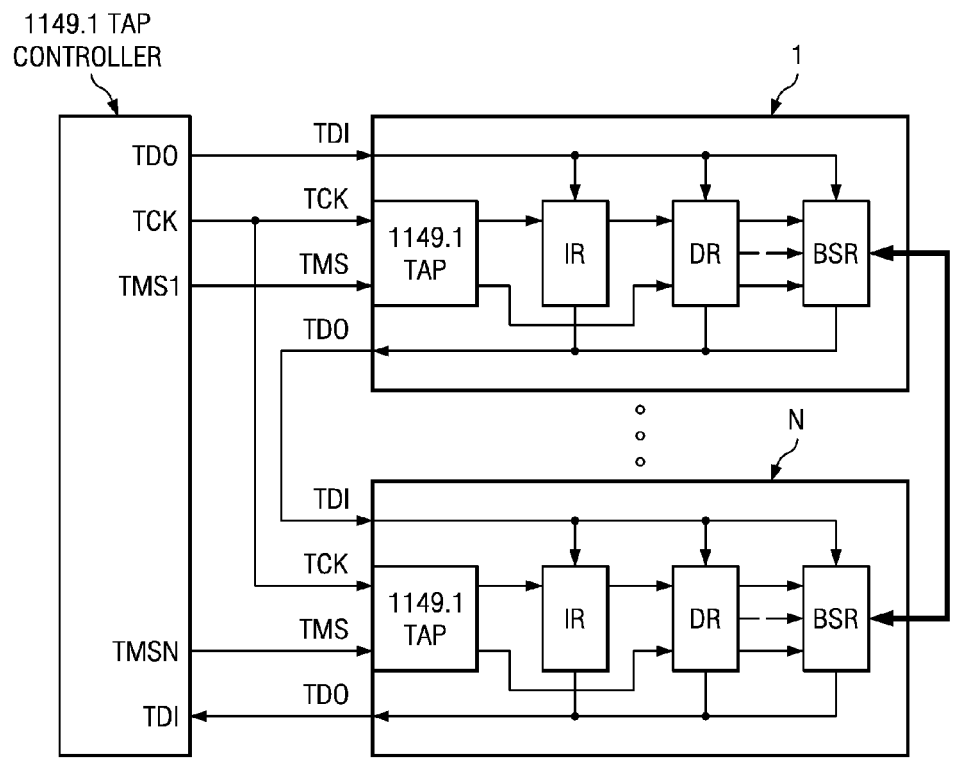
FIG. 4 illustrates a first star connection between an 1149.1 TAP controller and two devices with 1149.1 TAPs.
Figure 5:
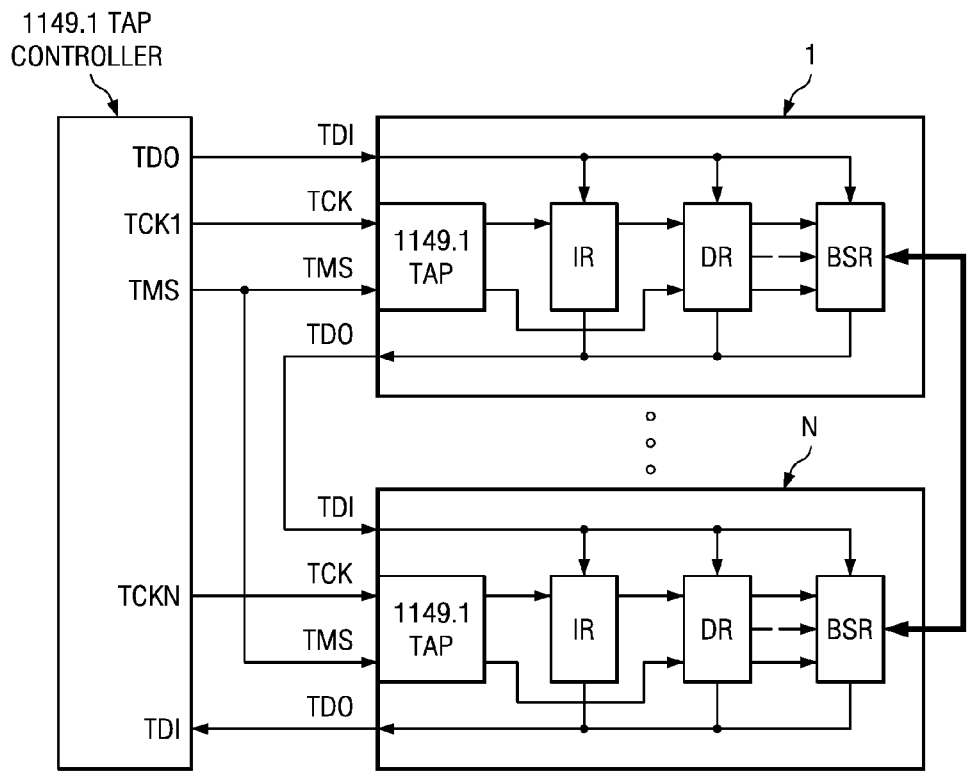
FIG. 5 illustrates a second star connection between an 1149.1 TAP controller and two devices with 1149.1 TAPs.
Figure 8:
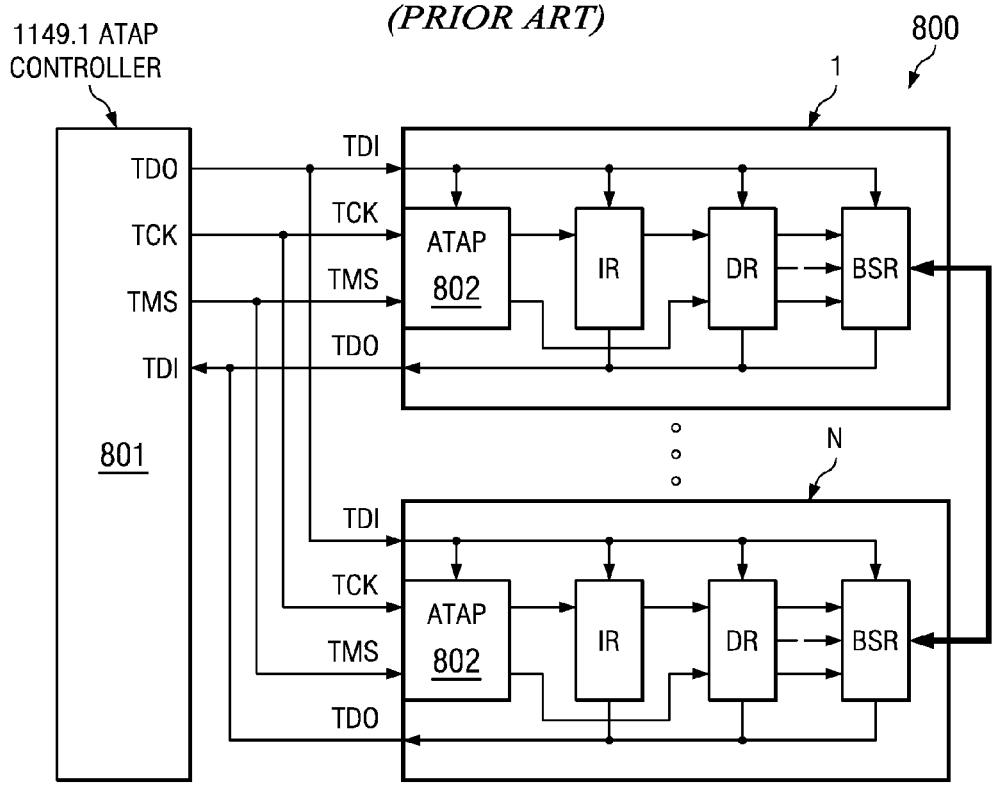
FIG. 8 illustrates a TAP controller connected to two device using Addressable TAPs (ATAP) according to the disclosure.

FIG. 8 illustrates the addressable device TAP arrangement 800 of the present disclosure. As seen, a TAP controller 801, adapted for addressing device TAPs according to the present disclosure, is coupled to addressable TAPs (ATAP) 802 of devices 1-N via TDI, TCK, TMS, and TDO signal wires. Using ATAPs 802 in the devices, each device may be selected for communicating with the TAP controller or be deselected from communicating with the TAP controller using the TAP state sequences 702-710 of FIG. 7. As seen, the number of signal wires between the TAP controller and device ATAPs is only four, or five if the optional TRST signal is used. The addressable TAP arrangement of FIG. 8 is similar in operation to the Star arrangements of FIGS. 4 and 5 in that each device may be accessed independent of the other devices. The advantage FIG. 8 has over the Star arrangements of FIGS. 4 and 5 is that it only requires a TDI, TCK, TMS, TDO interface between the TAP controller and the devices. For example, the Star arrangement of FIG. 4 requires the TDI, TCK, and TDO signals plus a unique TMS for each device. Similarly, Star arrangement of FIG. 5 requires the TDI, TMS, and TDO signal plus a unique TCK for each device. The interface wiring for 20 devices in FIG. 8 requires only four wires for the TDI, TCK, TMS, and TDO signals. The interface wiring for 20 devices in FIG. 4 requires three wires for TDI, TCK, and TDO plus 20 wires for the unique TMS signals. The interface wiring for 20 devices in FIG. 5 requires three wires for TDI, TMS, and TDO plus 20 wires for the unique TCK signals.

Figure 1:
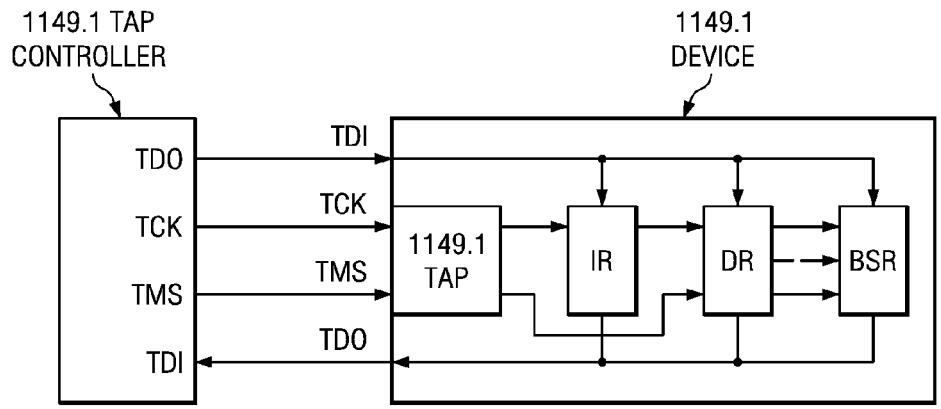
FIG. 1 illustrates a 1149.1 TAP controller connected to a 1149.1 TAPs of two devices.
Figure 9:
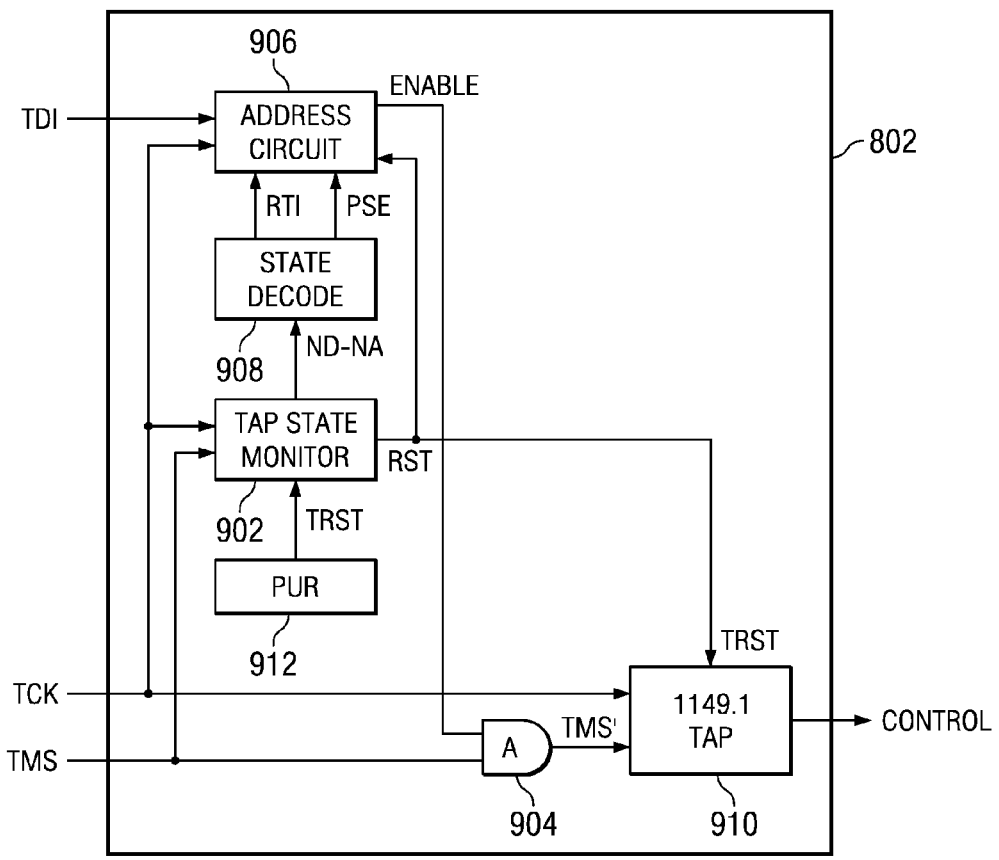
FIG. 9 illustrates an example ATAP circuit.

FIG. 9 illustrates an example implementation of the ATAP 802 of FIG. 8 according to the present disclosure. The ATAP 802 includes a TAP State Monitor 902, And gate 904, Address Circuit 906, TAP State Decode circuit 908, 1149.1 TAP state machine 910, and Power Up Reset (PUR) circuit 912, all connected as shown. In comparison, the 1149.1 TAPs shown in FIGS. 1, 3, 4, 5, only contain the 1149.1 TAP state machine 910 and possibly a PUR circuit 912 to reset the 1149.1 TAP state machine 910. The control output of the 1149.1 TAP state machine 910 controls instruction and data register (IR and DR) shift operations as shown in FIG. 1. The TAP State Monitor 902, And gate 904, Address Circuit 906, and TAP state decode circuit 908 are added to the 1149.1 TAP state machine 910 to form the ATAP. The PUR circuit 912 serves to reset the TAP State Monitor circuit when the device first powers up by pulsing the TRST input of the TAP State Monitor low. The TAP State Monitor is a state machine that operates according to the state diagram of FIG. 2. When the TAP State Monitor resets it goes to the Test Logic Reset state of FIG. 2 where it outputs a reset (RST) signal to the Address Circuit 906 and 1149.1 TAP state machine 910 to reset them. The TAP State Monitor circuit can also be reset to the Test Logic Reset state of FIG. 2 by setting TMS high and inputting 5 TCKs, or by the optional TRST signal.

The And gate 904 serves to gate the TMS signal to the TMS' input of the 1149.1 TAP 910 on and off in response to the Enable signal from the Address Circuit 906. When gated on the 1149.1 TAP 910 receives the TMS signal on its TMS' input and operates as shown in the state diagram of FIG. 2. When gated off, the 1149.1 TAP 910 receives a low input on its TMS' input and remains in the Run Test/Idle, Pause-DR, or Pause-IR state. The Address Circuit 906 operates to input an address from TDI when the TAP State Monitor 902 is in the Run Test/Idle, Pause-DR, or Pause-IR state if the TDI control (C) signal is set high, as described and shown in sequences of FIG. 7. If the TDI control (C) signal is set low, the Address Circuit does not input an address during these states, again as described and shown in the sequences of FIG. 7. The State Decode circuit 908 serves to detect when the TAP State Monitor 902 is in the Run Test/Idle, Pause-DR, or Pause-IR state and to output state detection signals RTI (Run Test/Idle) and PSE (Pause-DR or Pause-IR) to the Address Circuit when this occurs.

Figure 10:
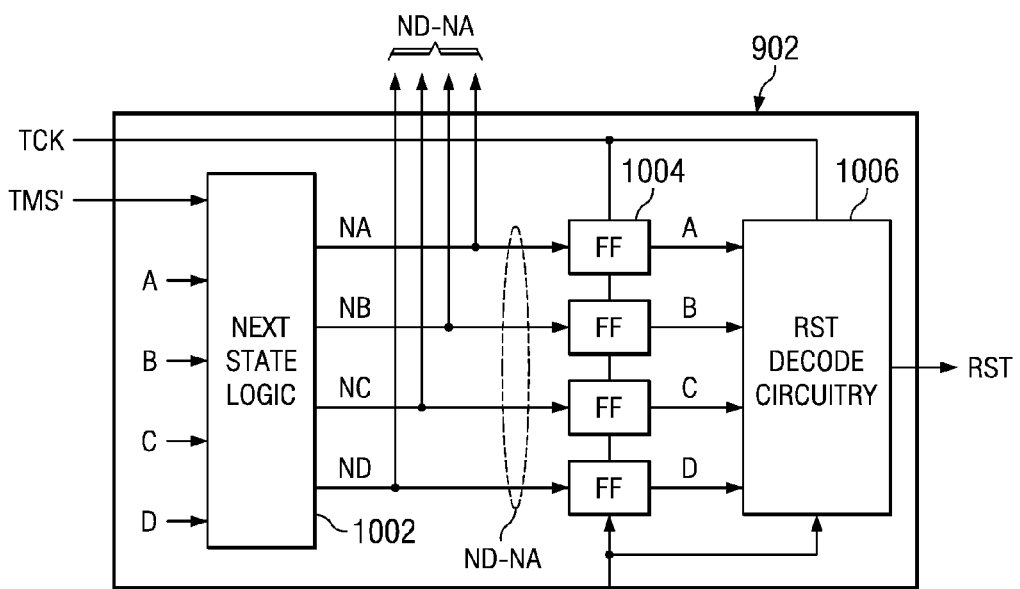
FIG. 10 illustrates an example implementation of a TAP State Monitor circuit used in an ATAP.

FIG. 10 illustrates an example implementation of the TAP State Monitor 902. The TAP State Monitor 902 includes next state logic 1002, state flip flops (FF) 1004, and RST Decode Circuitry 1006, all connected as shown. The RST Decode Circuitry sets the RST signal low when the TAP State Monitor is in the Test Logic Reset state. The TAP State Monitor responds to the TCK and TMS inputs to transition through the states of the FIG. 2 state diagram. The next state logic 1002 operates to input present state (A-D) signals from the FFs 1004 and the TMS signal and to output next state signals (NA-ND) to the FFs 1004 and State Decode circuit 908.

Figure 11:
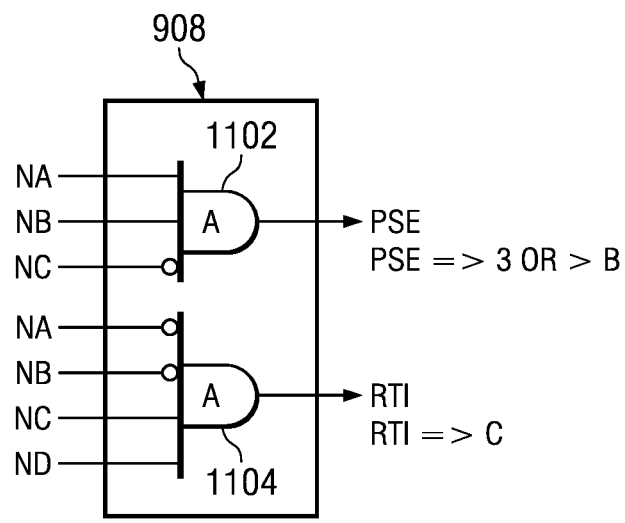
FIG. 11 illustrates an example implementation of State Decode circuitry used in an ATAP.

FIG. 11 illustrates an example implementation of the State Decode circuit 908 which includes And gates 1102 and 1104. And gate 1102 detects when the next state (ND-NA) of the TAP State Monitor 902 is either the Pause-DR (>3 in this example) state or the Pause-IR (>B in this example) state and outputs a Pause-DR/IR (PSE) signal to the Address Circuit 906. And gate 1104 detects when the next state (ND-NA) of the TAP State Monitor 902 is the Run Test/Idle (>C in this example) state and outputs a Run Test/Idle (RTI) signal to the Address Circuit 906. In response to receiving a logic high on the control (C) signal from TDI and a logic high on either the PSE or RTI signals, the Address Circuit 906 inputs an address from the TDI input.

Figure 12:
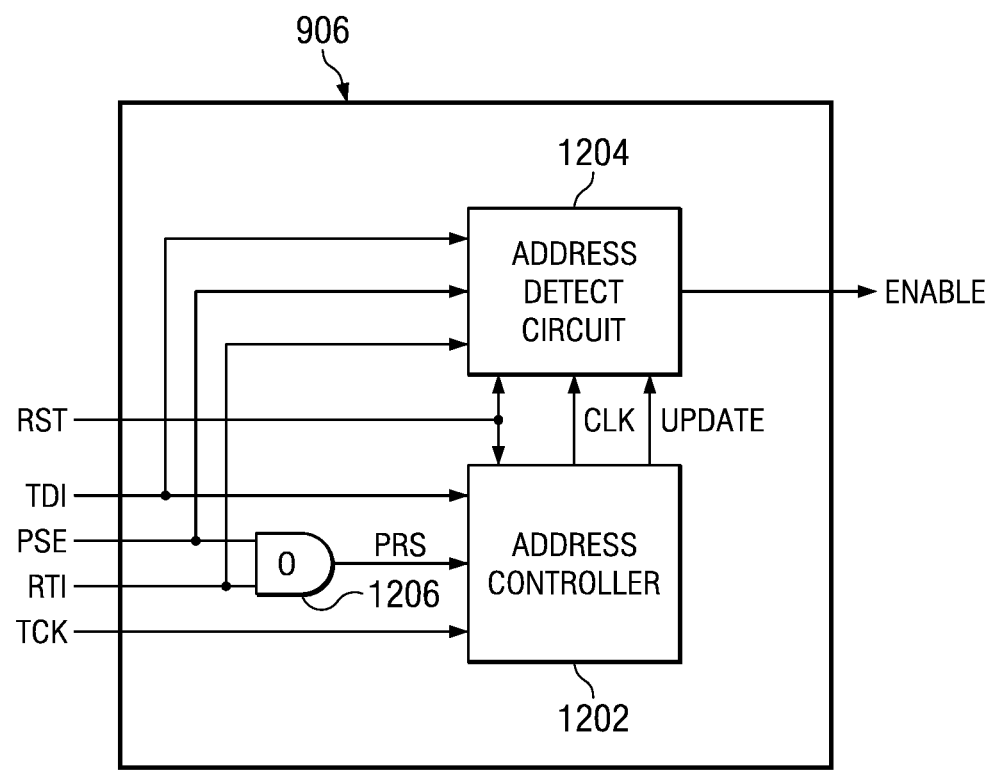
FIG. 12 illustrates an example implementation of an Address Circuit used in an ATAP.

FIG. 12 illustrates an example implementation of the Address Circuit 906. The Address Circuit includes an Address Controller 1202, Address Detect Circuit 1204, and Or gate 1206, all connected as shown. The Address Controller is timed by TCK to poll the states of the TDI input and the PSE or RTI Signal (PRS) output from Or gate 1206. When TDI and PRS are both high, the Address Controller enables the CLK input to the Address Detect Circuit. In response to the CLK, the Address Detect Circuit 1204 inputs a number of address bits from the TDI signal. The number of address bits input to the Address Detect Circuit 1204 is determined by a counter within the Address Controller 1202. If the address shifted into the Address Detect Circuit 1204 matches an expected address, the Enable output of the Address Detect circuit 1204 goes high in response to an Update signal from Address Controller 1202. When Enable is high, the TMS' input to the 1149.1 TAP state machine 910 is driven by TMS via And gate 904 and the 1149.1 TAP state machine 910 operates in lock step with the TAP State Monitor 902. After inputting an address the ATAP 802 may be transitioned out of the Run Test/Idle, Pause-IR or Pause-DR state.

FIG. 13 illustrates one example implementation for the Address Controller 1202 along with its operational state diagram. As seen the Address Controller 1202 comprises a state machine 1302, And gates 1304 and 1305, and counter 1307, all connected as shown. The state machine 1302 will be in an Idle state 1306 when a logic zero is detected on TDI or PRS, or when reset by the RST input from the TAP State Monitor 902. The counter 1307 is reset while the state machine 1302 is in the Idle state 1306. The state machine 1302 will transition to the shift address register (Shift) state 1308 when a logic one is detected on TDI and PRS. In the Shift state 1308, the counter is enabled to count in response to the TCK input. The state machine will remain in the Shift state 1308 until the counter reaches a count complete (CC) state. During the Shift state 1308 the state machine enables And gate 1304 to pass the TCK signal to the CLK output signal of And gate 1304. The CLK signal clocks the Address Detect Circuit 1204 to input an address from TDI. The state machine transitions to the Update state 1309 when the CC signal from counter 1307 goes high at the end of a count period. During the Update state 1309 the state machine enables And gate 1305 to pass the TCK signal to the Update output signal of And gate 1305. The Update signal stores the result of a comparison between the shifted in address and another address in the Address Detect Circuit 1204. The state machine transitions from the Update state 1309 to the Idle state 1306 when a logic zero is detected on PRS.

FIG. 14 illustrates one example implementation for the Address Detect Circuit 1204 which comprises a Group 1 Address circuit 1402, Group 2 Address circuit 1403, Local Address circuit 1404, Global Address circuit 1406, address compare circuits 1408-1412, Address Register 1414, Or gate 1416, and FF 1417, all connected as shown. The Group 1 Address 1402 is used to select a group of two or more devices whose ATAP 802 have been placed in either the Pause-DR or Pause-IR state, which is indicated by PSE being high. The value of the Group 1 Address is the same for all ATAPs. The Group 2 Address 1403 is used to select a group of two or more devices whose ATAP 802 have been placed in the Run Test/Idle state, which is indicated by RTI being high. The value of the Group 2 Address is the same for all ATAPs. The Local Address 1404 is used to select an individual device's ATAP 802 when the ATAP is placed in the Run Test/Idle, Pause-DR, or Pause-IR states. The value of the Local Address is unique for each ATAP. The Global Address 1406 is used to select all device ATAPs 802 that have been placed in the Run Test/Idle, Pause-DR, and Pause-IR state. Before inputting the Global Address, all device ATAPs should be placed in a common steady state, i.e. all in Run Test/Idle, all in Pause-DR, or all in Pause-IR. However the Global Address will select all ATAPs even if the ATAPs are in separate Run Test/Idle, Pause-DR, or Pause-IR states. The value of the Global Address is the same for all ATAPs.

When the CLK input is active, address data from TDI is shifted into Address Register 1414, which is a shift register. At the end of the shift operation, the address loaded into the Address Register 1414 is compared against the Group 1, Group 2, Local, and Global Addresses using the address compare circuits 1408-1412. If the address in the Address Register matches the Global Address, compare circuit 1412 outputs a high to set the output of OR gate 1416 high. FF 1417 outputs the high on the Enable signal on the falling edge of the Update signal from Address Controller 1202. If the address in the Address Register matches the Local Address, compare circuit 1410 outputs a high to set the output of OR gate 1416 high. FF 1417 outputs the high on the Enable signal on the falling edge of the Update signal. If the address in the Address Register matches the Group 1 Address and the PSE signal is high, compare circuit 1408 outputs a high to set the output of OR gate 1416 high. FF 1417 outputs the high on the Enable signal on the falling edge of the Update signal. If the address in the Address Register matches the Group 2 Address and the RTI signal is high, compare circuit 1409 outputs a high to set the output of OR gate 1416 high. FF 1417 outputs the high on the Enable signal on the falling edge of the Update signal. If none of the addresses match the address in the Address Register 1404 the output of OR gate 1416 is set low. FF 1417 outputs the low on the Enable signal on the falling edge of the Update signal. When the Enable output goes high as a result of an address match, the ATAP's 1149.1 TAP state machine 910 is enabled in lock step with the TAP State Monitor 902 and responds to TMS inputs to transition through the state diagram of FIG. 2. FF 1417 maintains the high or low setting of the Enable output until the next time an address is input to the Address Detect Circuit 1204. If the RST input goes low, the Address Register 1414 is reset and FF 1417 is reset which sets the Enable signal low.

It should be understood that when an 1149.1 TAP 910 of an ATAP 802 is deselected (Enable=0) in the Run Test/Idle, Pause-IR or Pause-DR state, it should only be selected again (Enable=1) in the state it was deselected in, i.e. Run Test/Idle, Pause-IR or Pause-DR state. This allows the TAP 910 and TAP State Monitor 902 to remain state synchronous with each other.

FIG. 15 illustrates an example implementation of Address Compare circuits 1408 and 1409 which comprise a comparator 1502 and And gate 1504 connected as shown. For Address Compare circuit 1408, the comparator inputs the Group 1 Address and the address in the Address Register 1414 and outputs the result of the compare to an input of And gate 1504. For Address Compare circuit 1408, the other input of the And gate 1504 is connected to the PSE signal from State Decode circuit 908. For Address Compare circuit 1409, the comparator inputs the Group 2 Address and the address in the Address Register 1414 and outputs the result of the compare to an input of And gate 1504. For Address Compare circuit 1409, the other input of the And gate 1504 is connected to the RTI signal from State Decode circuit 908. If an address match occurs in Address Compare circuit 1408 and the PSE signal is high, the output from And gate 1504 to OR gate 1416 goes high, otherwise the output of And gate 1504 is low. If an address match occurs in Address Compare circuit 1409 and the RTI signal is high, the output from And gate 1504 to OR gate 1416 goes high, otherwise the output of And gate 1504 is low.

FIG. 16 illustrates an example implementation of Address Compare circuits 1410 and 1412 which comprise a comparator 1602. For Address Compare circuit 1410, the comparator inputs the Local Address and the address in the Address Register 1414 and outputs the result of the compare to an input of OR gate 1416. For Address Compare circuit 1412, the comparator inputs the Global Address and the address in Address Register 1414 and outputs the result of the compare to an input of OR gate 1416. If a match is detected between the Local Address and the address in the Address Register 1414, the output of the OR gates from Address Compare circuit 1410 will be high, otherwise it will be low. If a match is detected between the Group Address and the address in the Address Register 1414, the output of the OR gate from Address Compare circuit 1412 will be high, otherwise it will be low.

Figure 17:
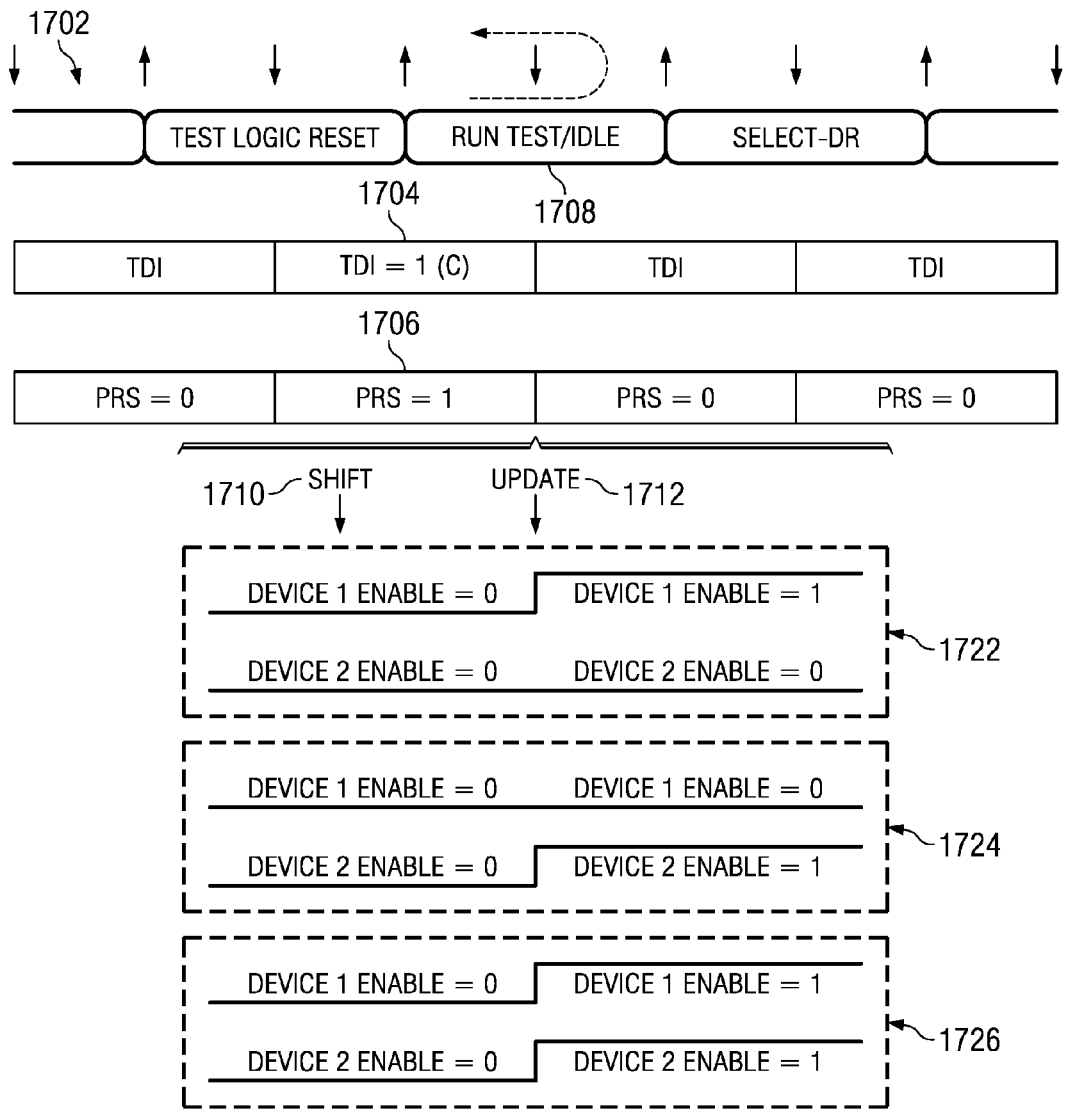
FIG. 17 illustrates a first example of inputting an address during the Run Test/Idle state.

FIG. 17 illustrates a timing example of inputting an address into the ATAPs 802 of two devices during the transition from Test Logic Reset to Run Test/Idle to Select-DR states. During the Test Logic Reset state, both devices are reset and deselected (Enable=0). The state transitions occur on the rising edge of TCK 1702. The devices could be the devices of FIG. 8. As seen the TDI control bit 1704 and PRS signal 1706 are set high upon entering Run Test/Idle, which initiates the address input and update process. The ATAP remains in the Run Test/Idle state 1708 for the number of CLK (TCK) inputs required to Shift in the address bits from TDI at time 1710 and to Update the address compare results into FF 1417 at time 1712. Device selection result 1722 illustrates an example where device 1 is enabled for access and a device 2 remains disabled from access. Device selection result 1724 illustrates an example where device 2 is enabled for access and device 1 remains disabled from access. Device selection result 1726 illustrates where both device 1 and 2 are enabled for access.

Figure 2:
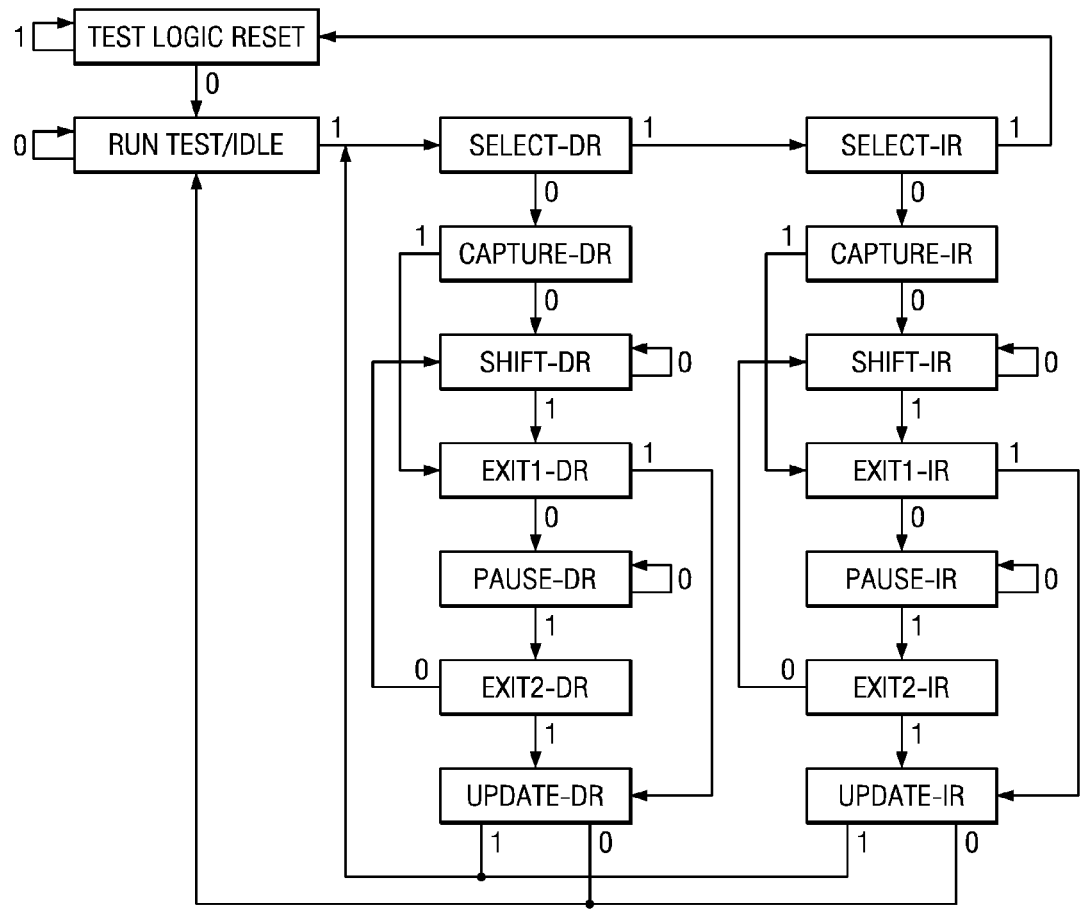
FIG. 2 illustrates the state diagram of an 1149.1 TAP state machine.
Figure 3:
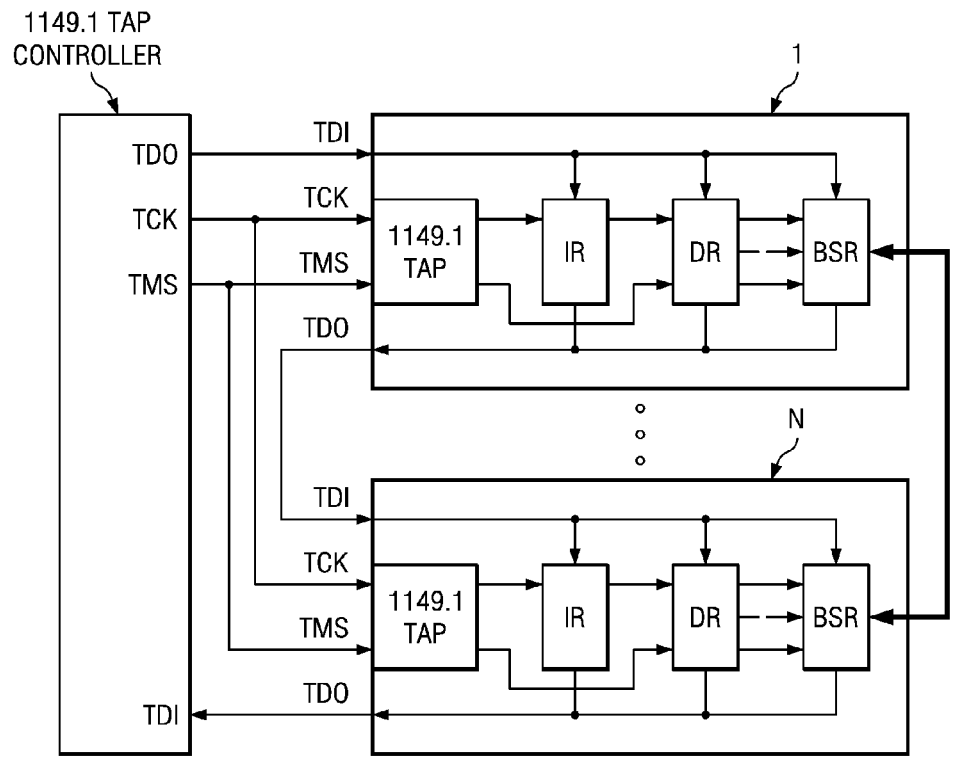
FIG. 3 illustrates a daisy-chain connection between a 1149.1 TAP controller and two devices with 1149.1 TAPs.

It is assumed at this point and beyond that if more than one device is selected, for example the device selection result 1726, using the Group 1, Group 2, or Global address, the access will only involve state transitions in the state diagram of FIG. 2 that avoid entry into the Shift-DR and Shift-IR states. This avoids TDO output conflicts between devices sharing a common TDO connection, since a device TDO output is enabled during the Shift-DR and Shift-IR state. However, if entry into the Shift-DR or Shift-IR states are required, for example to allow inputting instruction or data to multiple selected devices at the same time via TDI, the Address Detect Circuit 1204 of FIG. 14 can be implemented differently as shown in FIG. 14A to disable the device TDO output buffer 1420 whenever a match is detected between the address shifted in and the Group 1, Group 2, or Global addresses. As seen an OR gate 1422 and FF 1424 are added to detect and latch a TDO Disable signal 1428 whenever a Group 1, Group 2, or Global address is input and updated. The TDO Disable signal 1426 overrides any other TDO enable signal, via gating 1426, to insure that the TDO output buffer 1420 is disabled while Group 1, Group 2, and Global addresses are in effect.

Figure 18:
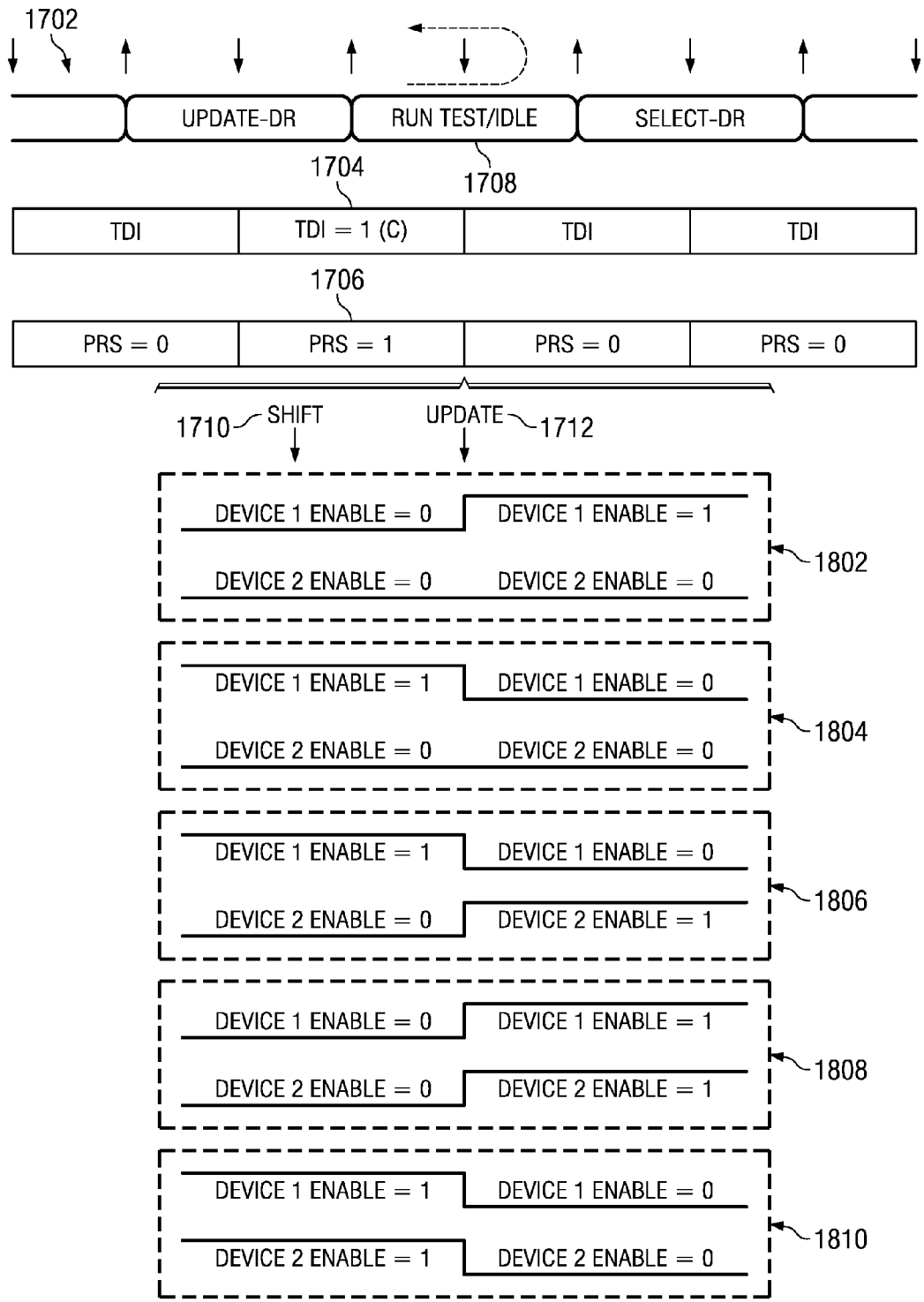
FIG. 18 illustrates a second example of inputting an address during the Run Test/Idle state.

FIG. 18 illustrates a timing example of inputting an address into the ATAPs 802 of two devices during the transition from Update-DR to Run Test/Idle to Select-DR states. The state transitions occur on the rising edge of TCK 1702. The devices could be the devices of FIG. 8. As seen the TDI control bit 1704 and PRS signal 1706 are set high upon entering Run Test/Idle, which initiates the address input and update process. The ATAP remains in the Run Test/Idle state 1708 for the number of CLK (TCK) inputs required to Shift in the address bits from TDI at time 1710 and to Update the address compare results into FF 1417 at time 1712. Device selection result 1802 illustrates an example where device 1 is enabled for access and a device 2 remains disabled from access. Device selection result 1804 illustrates an example where device 1 is disabled from access and device 2 remains disabled from access. Device selection result 1806 illustrates where device 1 is disabled from access and device 2 is enabled for access. Device selection result 1808 illustrates where both devices are enabled for access. Device selection result 1810 illustrates where both devices are disabled from access.

Figure 19:
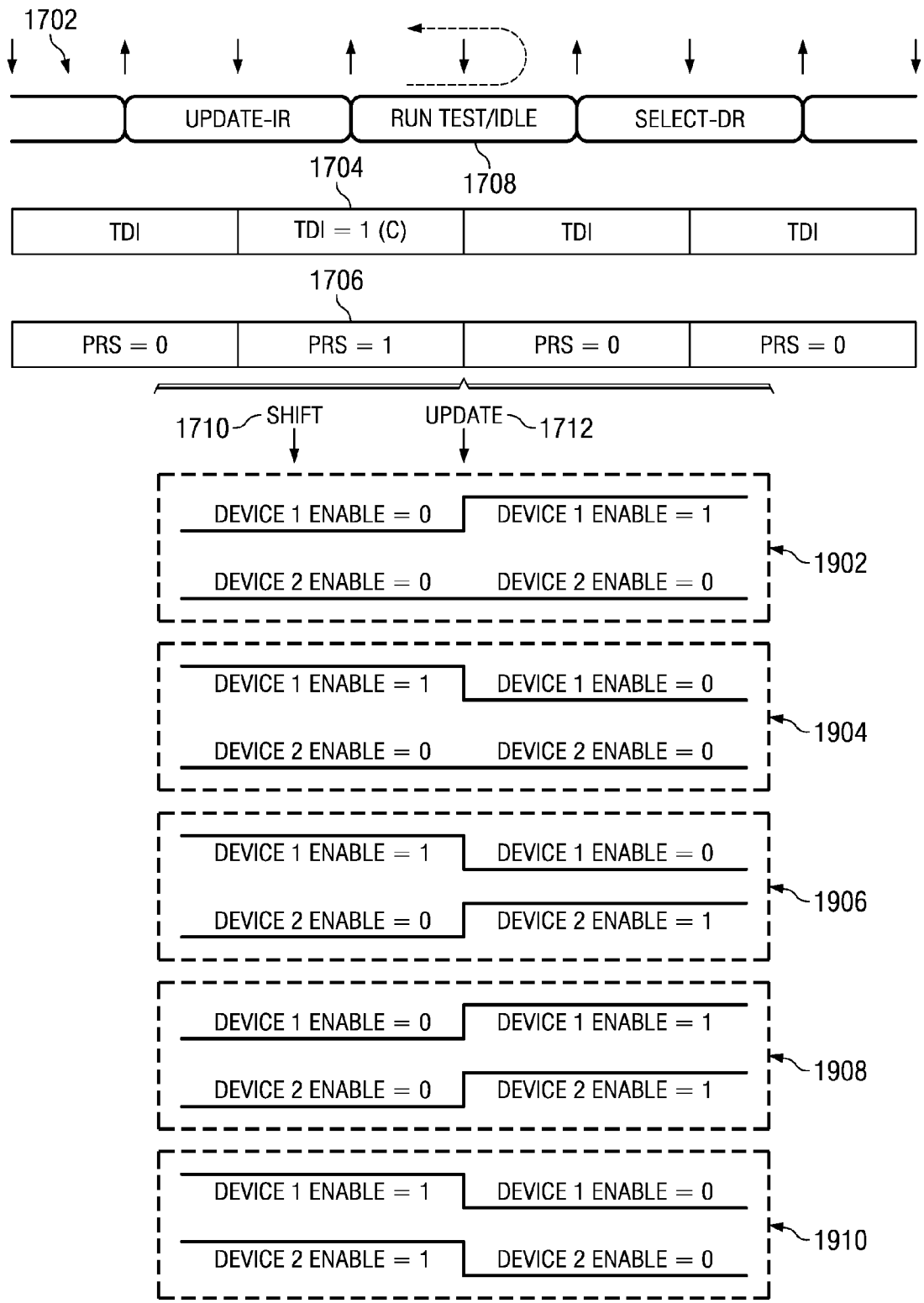
FIG. 19 illustrates a third example of inputting an address during the Run Test/Idle state.

FIG. 19 illustrates a timing example of inputting an address into the ATAPs 802 of two devices during the transition from Update-IR to Run Test/Idle to Select-DR states. The state transitions occur on the rising edge of TCK 1702. The devices could be the devices of FIG. 8. As seen the TDI control bit 1704 and PRS signal 1706 are set high upon entering Run Test/Idle, which initiates the address input and update process. The ATAP remains in the Run Test/Idle state 1708 for the number of CLK (TCK) inputs required to Shift in the address bits from TDI at time 1710 and to Update the address compare results into FF 1417 at time 1712. Device selection result 1902 illustrates an example where device 1 is enabled for access and a device 2 remains disabled from access. Device selection result 1904 illustrates an example where device 1 is disabled from access and device 2 remains disabled from access. Device selection result 1906 illustrates where device 1 is disabled from access and device 2 is enabled for access. Device selection result 1908 illustrates where both devices are enabled for access. Device selection result 1910 illustrates where both devices are disabled from access.

Figure 20:
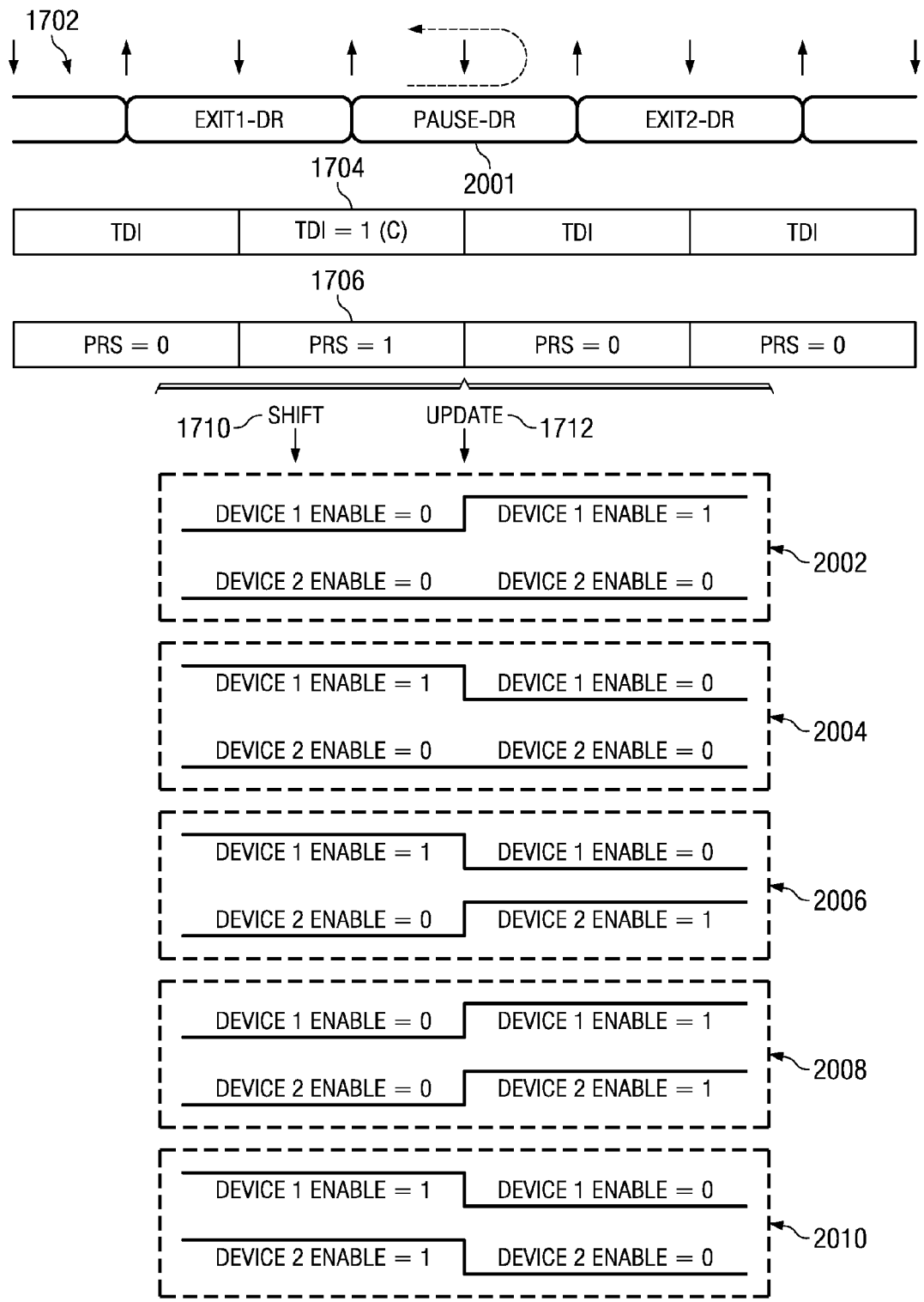
FIG. 20 illustrates an example of inputting an address during the Pause-DR state.

FIG. 20 illustrates a timing example of inputting an address into the ATAPs 802 of two devices during the transition from Exit1-DR to Pause-DR to Exit2-DR states.

The state transitions occur on the rising edge of TCK 1702. The devices could be the devices of FIG. 8. As seen the TDI control bit 1704 and PRS signal 1706 are set high upon entering Pause-DR, which initiates the address input and update process. The ATAP remains in the Pause-DR state 2001 for the number of CLK (TCK) inputs required to Shift in the address bits from TDI at time 1710 and to Update the address compare results into FF 1417 at time 1712. Device selection result 2002 illustrates an example where device 1 is enabled for access and a device 2 remains disabled from access. Device selection result 2004 illustrates an example where device 1 is disabled from access and device 2 remains disabled from access. Device selection result 2006 illustrates where device 1 is disabled from access and device 2 is enabled for access. Device selection result 2008 illustrates where both devices are enabled for access. Device selection result 2010 illustrates where both devices are disabled from access.

Figure 21:
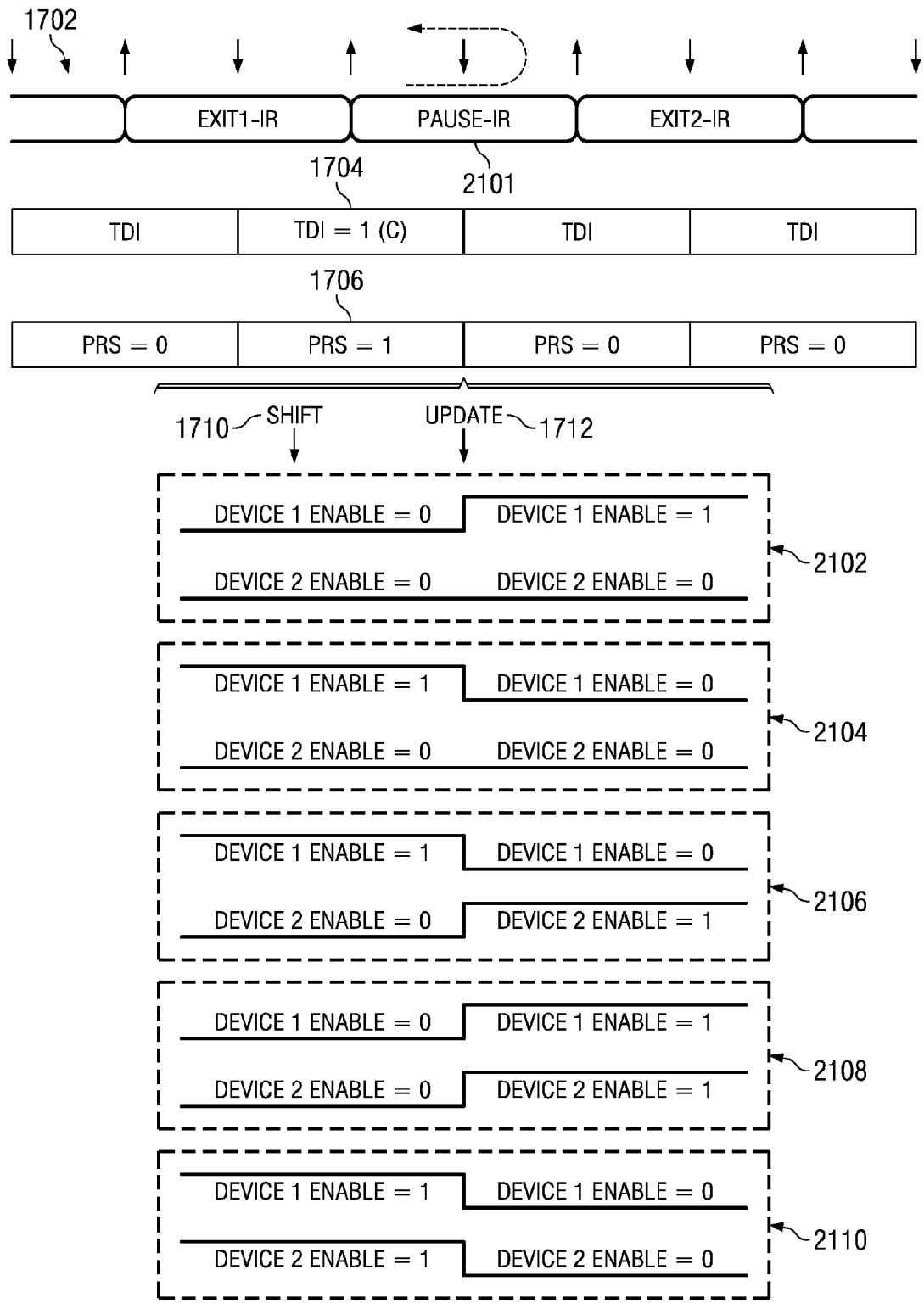
FIG. 21 illustrates an example of inputting an address during the Pause-IR state.

FIG. 21 illustrates a timing example of inputting an address into the ATAPs 802 of two devices during the transition from Exit1-IR to Pause-IR to Exit2-IR states. The state transitions occur on the rising edge of TCK 1702. The devices could be the devices of FIG. 8. As seen the TDI control bit 1704 and PRS signal 1706 are set high upon entering Pause-IR, which initiates the address input and update process. The ATAP remains in the Pause-IR state 2101 for the number of CLK (TCK) inputs required to Shift in the address bits from TDI at time 1710 and to Update the address compare results into FF 1417 at time 1712. Device selection result 2102 illustrates an example where device 1 is enabled for access and a device 2 remains disabled from access. Device selection result 2104 illustrates an example where device 1 is disabled from access and device 2 remains disabled from access. Device selection result 2106 illustrates where device 1 is disabled from access and device 2 is enabled for access. Device selection result 2108 illustrates where both devices are enabled for access. Device selection result 2110 illustrates where both devices are disabled from access.

Figure 22:
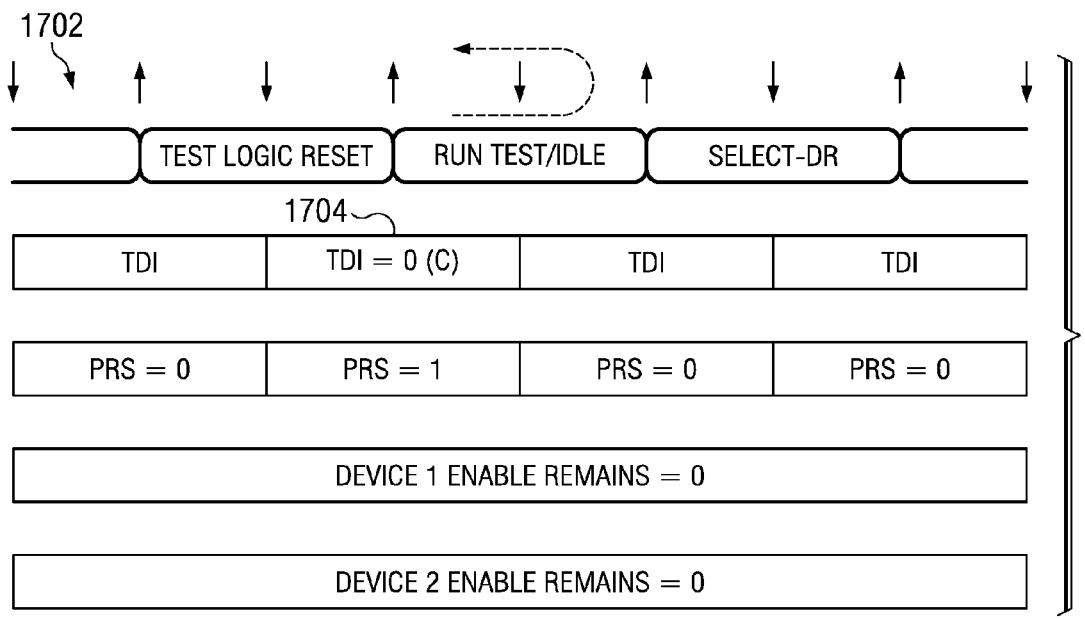
FIG. 22 illustrates a first example of not inputting an address during the Run Test/Idle state.

FIG. 22 illustrates a timing example of not inputting an address into the ATAPs of two devices during the transition from the Test Logic Reset state to the Run Test/Idle state to the Select-DR state. The transitions occur on the rising edge of TCK 1702. The devices could be the devices of FIG. 8. As seen the TDI control bit 1704 is low upon entering the Run Test/Idle state, which prevents the address input and update process. In this example both devices remain disabled through the state transitions.

Figure 23:
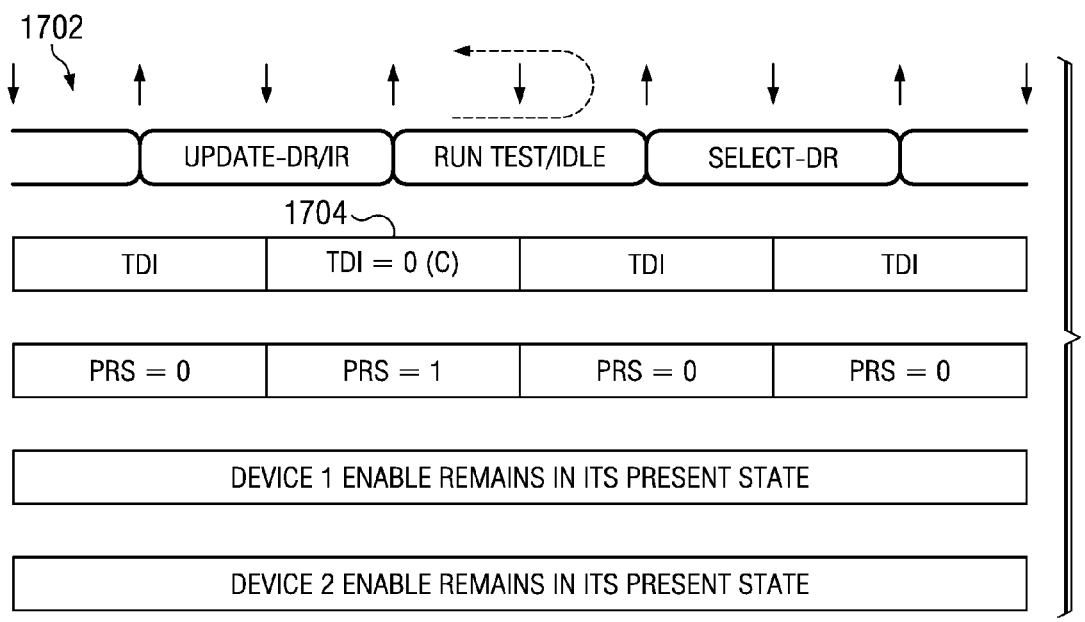
FIG. 23 illustrates a second example of not inputting an address during the Run Test/Idle state.

FIG. 23 illustrates a timing example of not inputting an address into the ATAPs of two devices during the transition from the Update-DR/IR to the Run Test/Idle state to the Select-DR state. The transitions occur on the rising edge of TCK 1702. The devices could be the devices of FIG. 8. As seen the TDI control bit 1704 is low upon entering the Run Test/Idle state, which prevents the address input and update process. In this example both devices remain in their present state through the state transitions.

Figure 24:
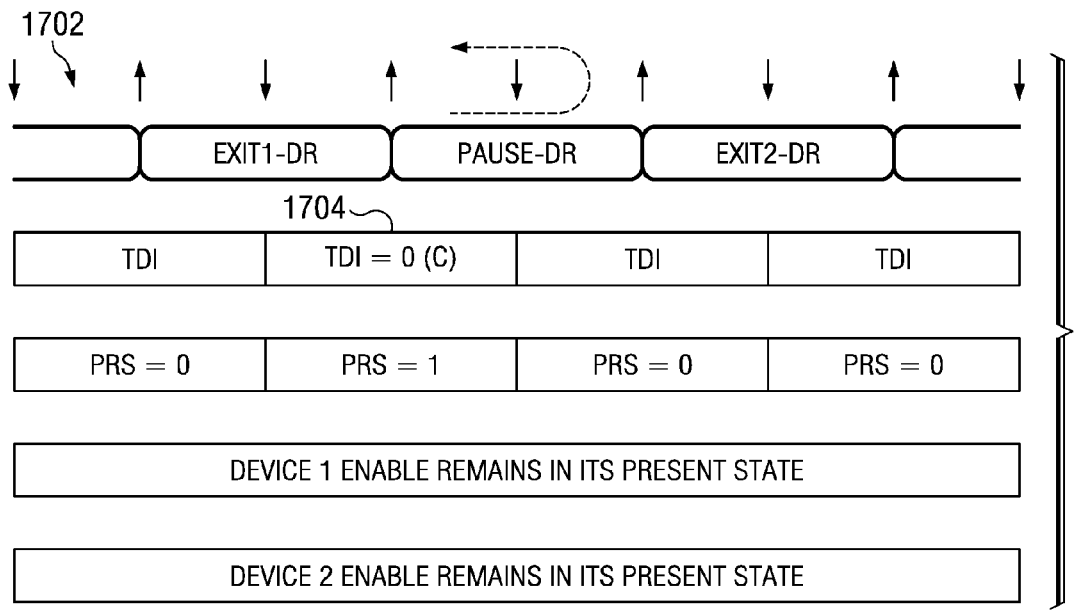
FIG. 24 illustrates an example of not inputting an address during the Pause-DR state.

FIG. 24 illustrates a timing example of not inputting an address into the ATAPs of two devices during the transition from the Exit1-DR state to the Pause-DR state to the Exit2-DR state. The transitions occur on the rising edge of TCK 1702. The devices could be the devices of FIG. 8. As seen the TDI control bit 1704 is low upon entering the Pause-DR state, which prevents the address input and update process. In this example both devices remain in their present state through the state transitions.

Figure 25:
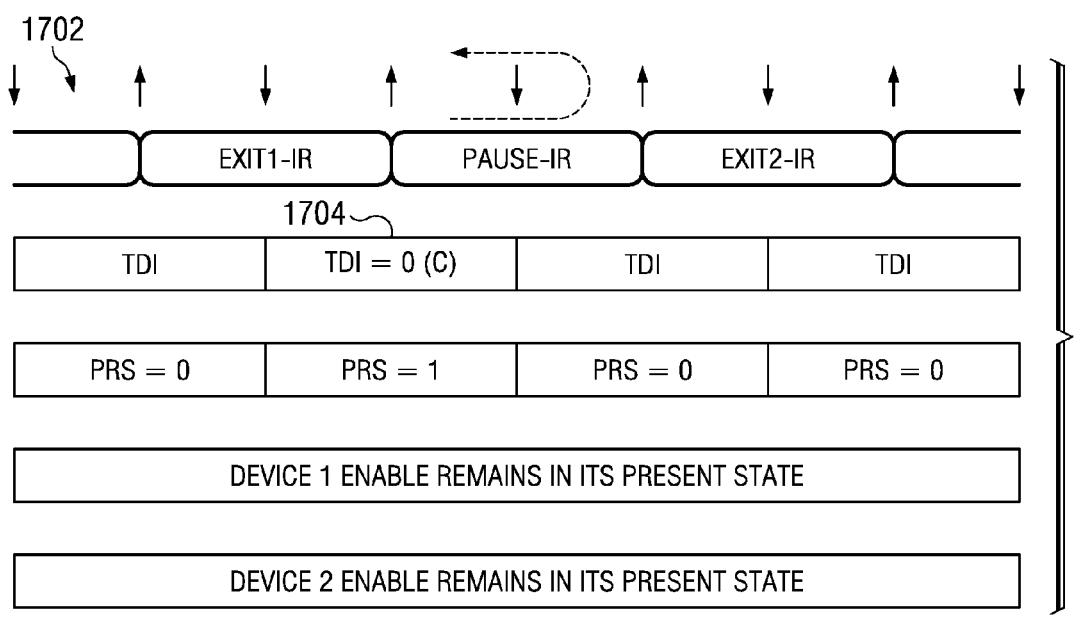
FIG. 25 illustrates an example of not inputting an address during the Pause-IR state.

FIG. 25 illustrates a timing example of not inputting an address into the ATAPs of two devices during the transition from the Exit1-IR state to the Pause-IR state to the Exit2-IR state. The transitions occur on the rising edge of TCK 1702. The devices could be the devices of FIG. 8. As seen the TDI control bit 1704 is low upon entering the Pause-IR state, which prevents the address input and update process. In this example both devices remain in their present state through the state transitions.

As can be seen from the timing examples of FIGS. 17-25, the state of the TDI control bit 1704 determines if an address input and address compare update operation occurs when the ATAP enters the Run Test/Idle, Pause-IR, or Pause-DR states.

Figure 26:
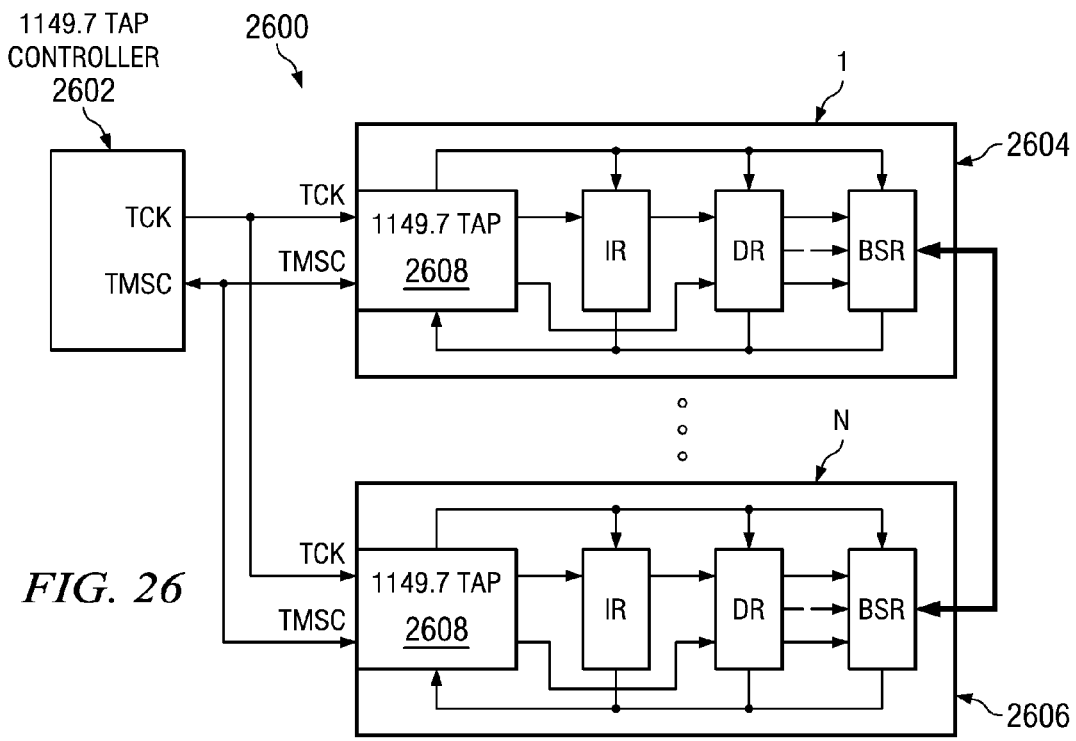
FIG. 26 illustrates a connection between an 1149.7 TAP controller and two devices with 1149.7 TAPs.

FIG. 26 illustrates a 2 wire Star arrangement 2600 between an IEEE 1149.7 TAP controller 2602 and devices 2604-2606 with IEEE 1149.7 TAPs 2608. IEEE 1149.7 is a standard in development that can reduce the number of interconnects between a TAP controller and TAPs in devices to a minimum of only two, a TCK signal and a TMSC signal.

Figure 27:
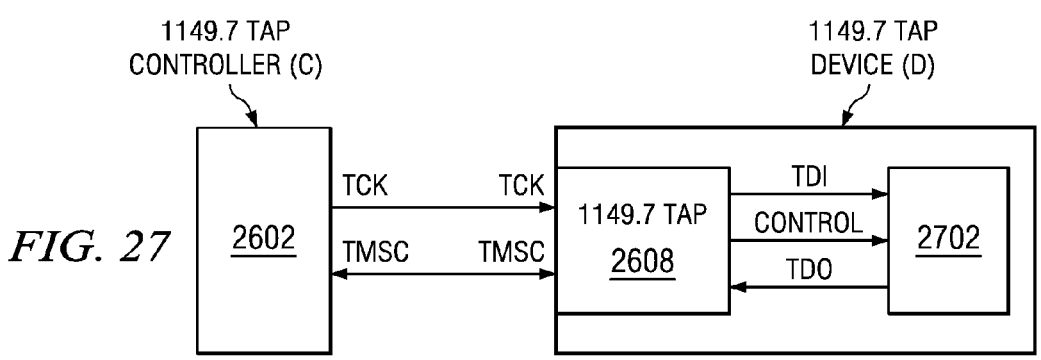
FIG. 27 illustrates a connection between an 1149.7 TAP controller and a device with an 1149.7 TAP.

FIG. 27 illustrates a simplified view of the 1149.7 TAP 2608 accessing 1149.1 instruction and data registers, shown in this example as a circuit block 2702, via a TDI input, control inputs, and a TDO output.

Figure 28:
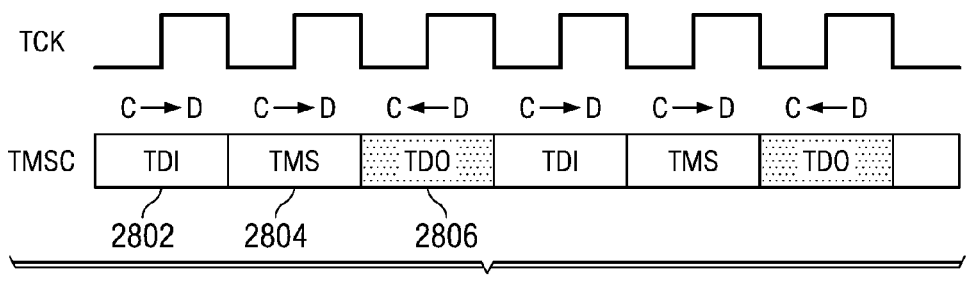
FIG. 28 illustrates example timing of transferring TDI, TMS and TDO signals between an 1149.7 TAP controller and a device with an 1149.7 TAP.

FIG. 28 illustrates one of the timing protocols 1149.7 uses to reduce the normal TDI, TCK, TMS, TDO four wire 1149.1 bus of FIG. 1 to only the TCK and TMSC two wire 1149.7 bus of FIGS. 26 and 27. As seen the 1149.7 TAP controller (C) 2602 transmits TDI and TMS data to the 1149.7 device (D) TAP via the TMSC wire at times 2802 and 2804 respectively, then the 1149.7 device (D) TAP transmits TDO data to the 1149.7 controller via the TMSC wire at time 2806. The order of the TDI and TMS signals transmitted may be reversed from that shown, i.e. TMS could be transmitted before TDI. This process of the 1149.7 TAP controller sending TDI and TMS data to the 1149.7 TAP over the TMSC wire followed by the 1149.7 TAP sending TDO data to the controller over the TMSC wire repeats during the access.

Figure 29:
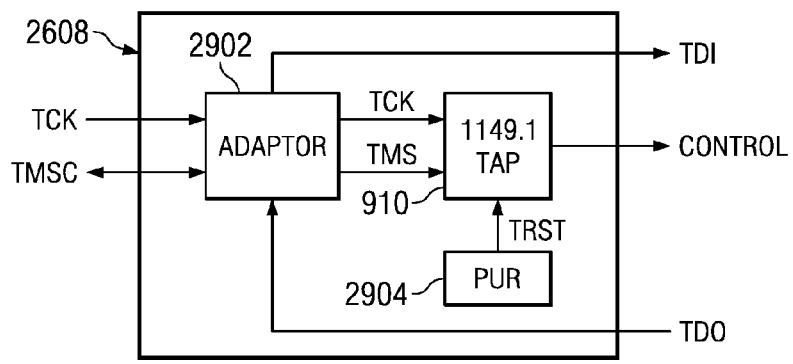
FIG. 29 illustrates an example implementation of an 1149.7 TAP interface.

FIG. 29 illustrates an example implementation of an 1149.7 TAP which includes an Adaptor circuit 2902, a standard 1149.1 TAP circuit 910, and a power up reset (PUR) circuit 2904. The Adaptor circuit 2902 receives the TDI and TMS signals serially from the controller 2602 via TMSC wire and outputs them as parallel TMS and TDI signals to the 1149.1 TAP 910 and instruction and data registers, respectively, as shown in FIG. 1. After receiving the serial TDI and TMS signals, the Adaptor circuit reverses the direction of the TMSC wire and outputs the TDO signal from the 1149.1 TAP 910 to the controller 2602 via the TMSC wire. The operation of the Adaptor circuit 2902 is transparent to the 1149.1 TAP 910 which responds to the TCK and TMS signals from the Adaptor to conventionally control TDI data input to and TDO data output from 1149.1 instruction and data registers within the device.

Currently IEEE 1149.7 TAPs in the 2 wire Star arrangement of FIG. 26 can only be addressed and selected for access by a 1149.7 TAP controller while they are in the Run Test/Idle state. It would be beneficial to provide a way to enhance 1149.7 TAPs so they are able to be addressed and selected for access in the Run Test/Idle, Pause-DR, and Pause-IR states as described using the Group 1, Group 2, Local, and Global addresses of the present disclosure. The following descriptions show how 1149.7 TAPs may be modified to include the addressing circuitry and methods of this disclosure.

Figure 30:
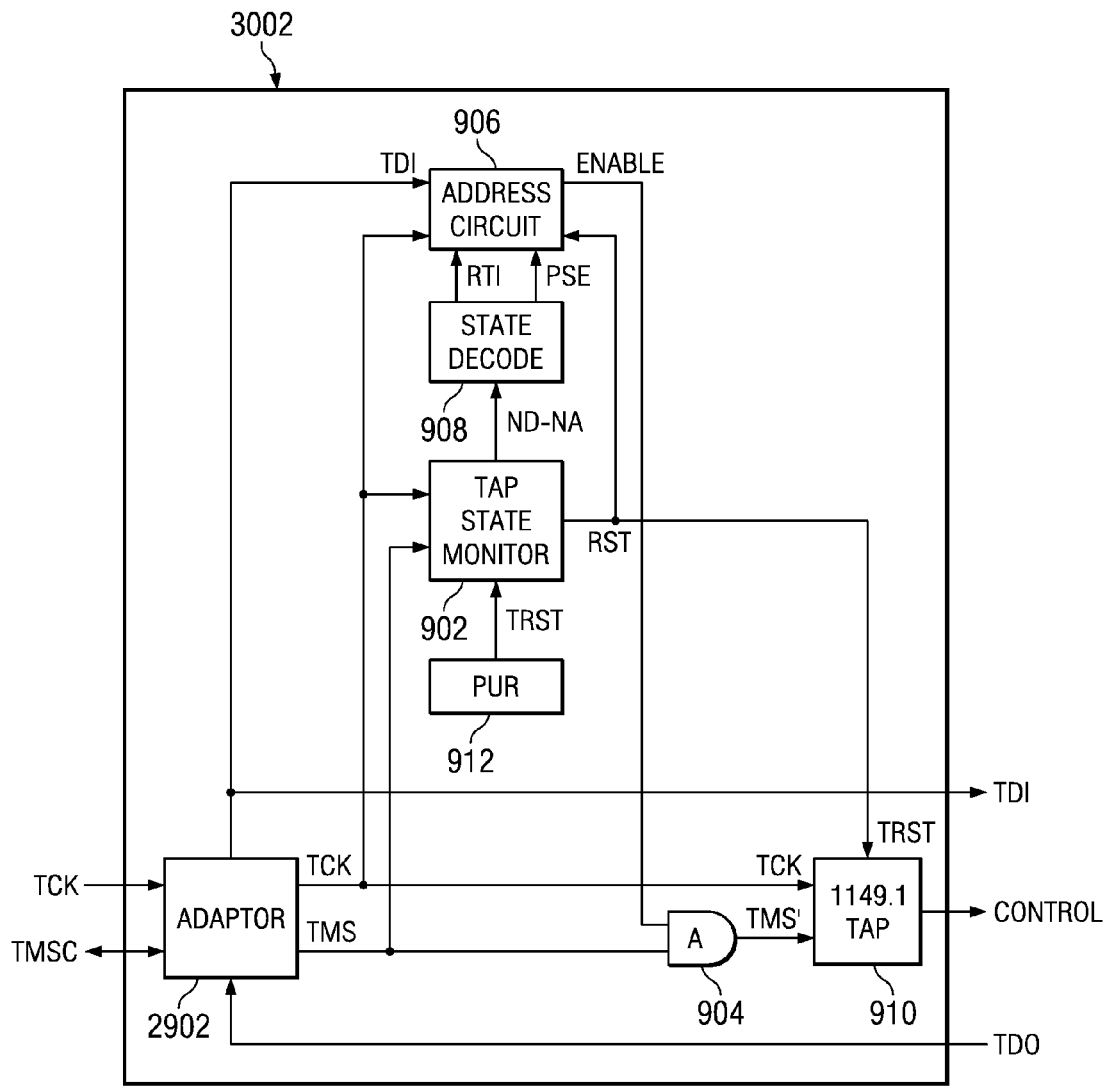
FIG. 30 illustrates an 1149.7 TAP interface including ATAP circuitry.

FIG. 30 illustrates an 1149.7 TAP 3002 that has been modified to include the addressing circuits of the present disclosure. The modifications include adding the Address Circuit 906, State Decode circuit 908, TAP State Monitor 902, PUR 912, and AND gate 904 to the Adaptor 2902 and 1149.1 TAP 910 of FIG. 29. The arrangement and connections of these added circuits is similar to the arrangement and connection of these circuits shown added to the 1149.1 TAP 910 of FIG. 9. The Address Circuit 906 receives the TDI and TCK signals from the Adaptor 2902 as it did for the device TDI and TCK input leads of FIG. 9. The TAP State Monitor 902 receives the TMS and TCK signals from the Adaptor 2902 as it did for the device TMS and TCK input leads of FIG. 9. The TMS signal normally connected between the Adaptor 2902 and 1149.1 TAP 910, according to the current state of the IEEE 1149.7 standard, is broken to insert the AND gate 904 between the Adaptor's TMS output and 1149.1 TAP's TMS' input, as the AND gate 904 was similarly inserted in the TMS signal path of FIG. 9. The other input to the AND gate 910 is connected to the Enable signal from the Address Circuit 906 as previously described in FIG. 9. The RST output from the TAP State Monitor 902 is connected to the TRST input of the 1149.1 TAP 910 as previously described in FIG. 9. In this arrangement the TDI, TCK, and TMS signals from the Adaptor operate the added addressing circuitry as previously described to enable and disable access to the 1149.1 TAP 910 in the Run Test/Idle, Pause-DR, and Pause-IR using the Group 1, Group 2, Local, and Global addresses.

While the present disclosure up to this point has described a method and apparatus for inputting an address for selecting a device TAP for access, it is not limited to only inputting of an address. The following descriptions and figures will illustrate how the disclosure can also be advantageously be used to input a command as well.

Figure 31:
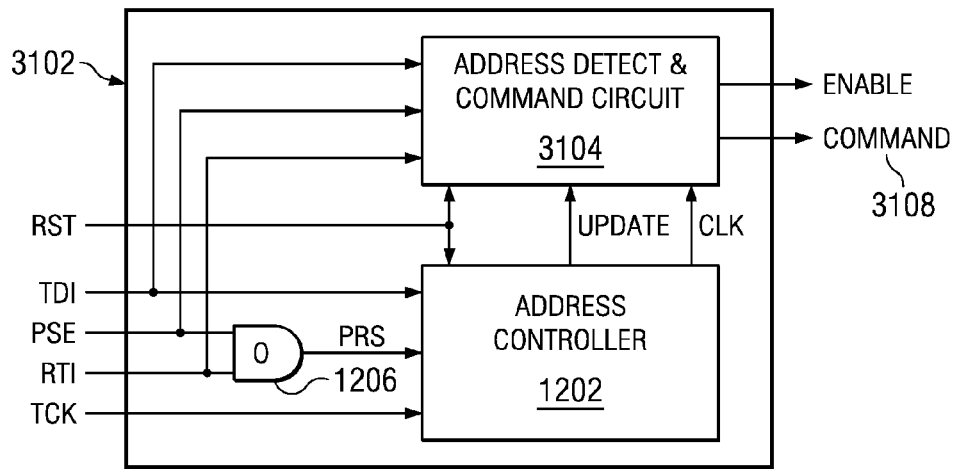
FIG. 31 illustrates an example Address & Command circuit for use in an ATAP.

FIG. 31 illustrates an Address & Command circuit 3102 that provides the previously described device TAP addressing feature plus the ability to also input a command to the device. The Address & Command circuit 3102 is the same as the Address circuit 906 of FIG. 12 with the exception that the Address Detect & Command Circuit 3104 has replaced the Address Detect Circuit 1204. The input and output signals of Address & Command circuit 3102 is the same as Address circuit 906 with the exception that circuit 3102 includes a command output bus 3108. The command bus 3108 may be used to provide any type of commands to a device including, but not limited to, commands used for device test purposes, commands used for device debug purposes, commands used for device trace purposes, and commands used for device programming purposes.

Figure 32:
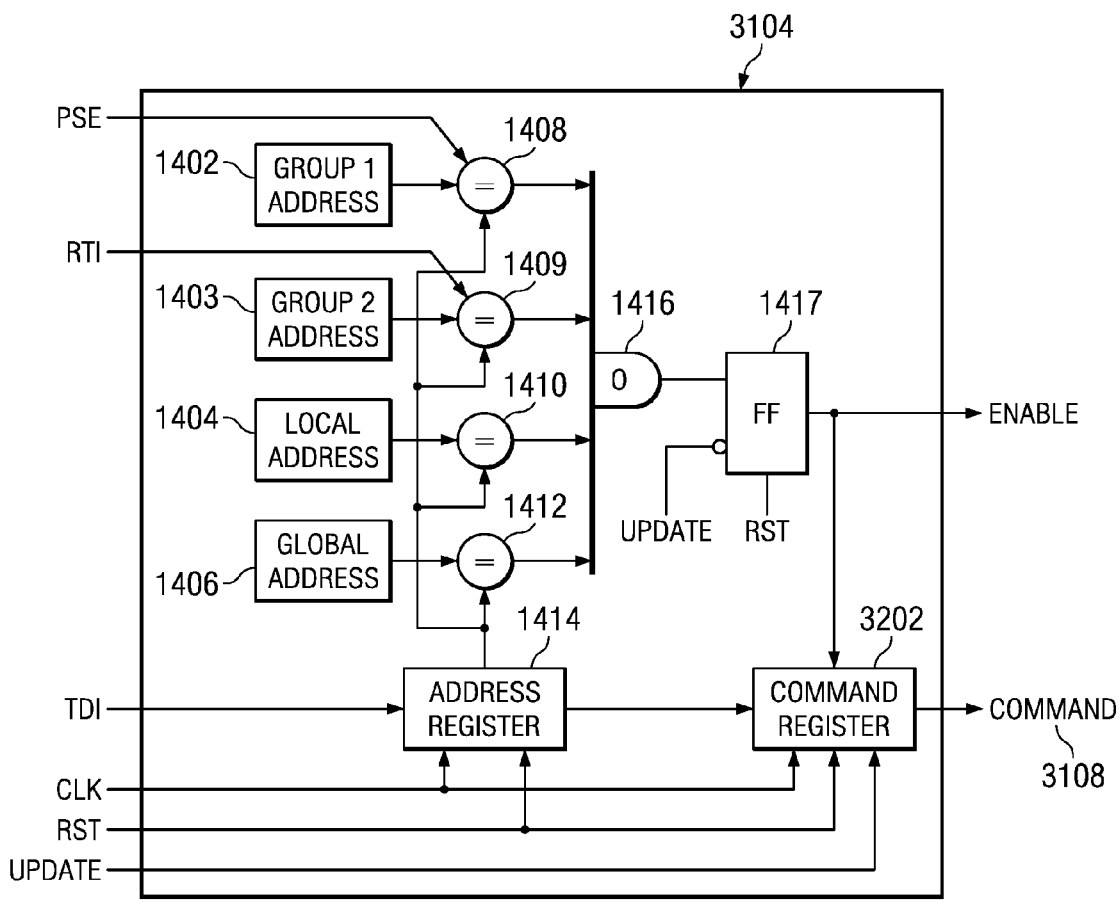
FIG. 32 illustrates an example Address Detect & Command Circuit for use in the Address & Command circuit of FIG. 31.

FIG. 32 illustrates an example implementation of Address Detect & Command circuit 3104. As can be seen, Address Detect & Command circuit 3104 is identical to Address Detect circuit 1204 of FIG. 14 with the exception that circuit 3104 includes a Command Register 3202 connected in series with the Address Register 1414. The Command Register 3202 is connected to; (1) the CLK signal from Address Controller 1202 to allow the Command Register to shift when the Address Register shifts, (2) the Enable signal from FF 1417 to allow the command output bus 3108 of Command Register 3202 to be updated at the end of a shift operation, (3) the RST signal to allow the Command Register to be reset when the Address Register is reset, and the Update signal from Address Controller 1202 to update the Command Register output bus 3108 with a new command, if the Enable signal is high.

Figure 33:
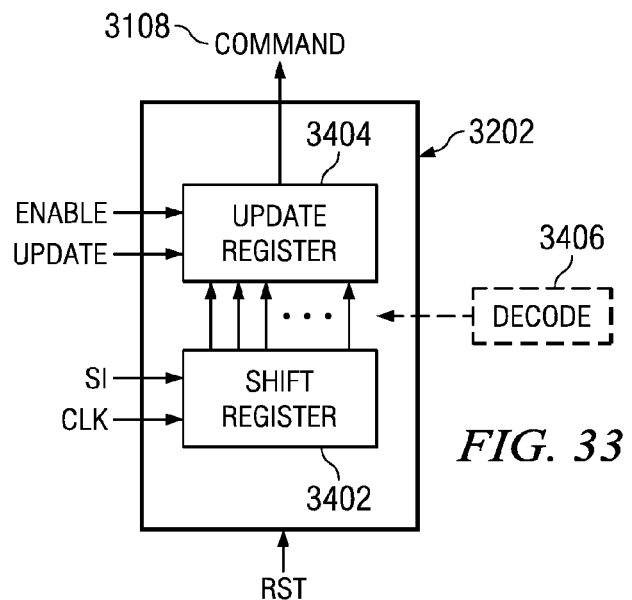
FIG. 33 illustrates an example implementation of a Command Register for use in the Address Detect & Command Circuit of FIG. 32.

FIG. 33 illustrates an example implementation of Command Register 3202 which consists of a Shift Register 3402 and Update Register 3404 connected as shown. During the Shift state 1308 of FIG. 13 the Shift Register 3402 responds to the CLK signal to shift in (SI) data from a shift output lead of Address Register 1414. During the Update state 1309 of FIG. 13 the Update Register 3404 updates its command output bus 3108 in response to the Update signal input from Address Controller 1202, if the Enable input from FF 1417 is high or otherwise asserted. The command output bus 3108 of Update Register 3404 is not updated in response to the Update signal if the Enable input from FF 1417 is low or otherwise de-asserted. The Shift Registers parallel outputs may be coupled directly to the Update Registers parallel inputs, or the parallel outputs and parallel inputs may be coupled via decode logic 3406. The Command Register 3202 is reset in response to the RST signal from TAP State Monitor 902. When reset, the Command Register's command output but 3108 will be set to output a known command as specified by the device designer.

The counter 1307 of FIG. 13 will provide a count length sufficient for shifting in and updating the address and command bits. The serial arrangement of the address register 1414 and command register 3202 could be reversed if desired such that the command register is placed ahead of the address register in the serial path.

Figure 34:
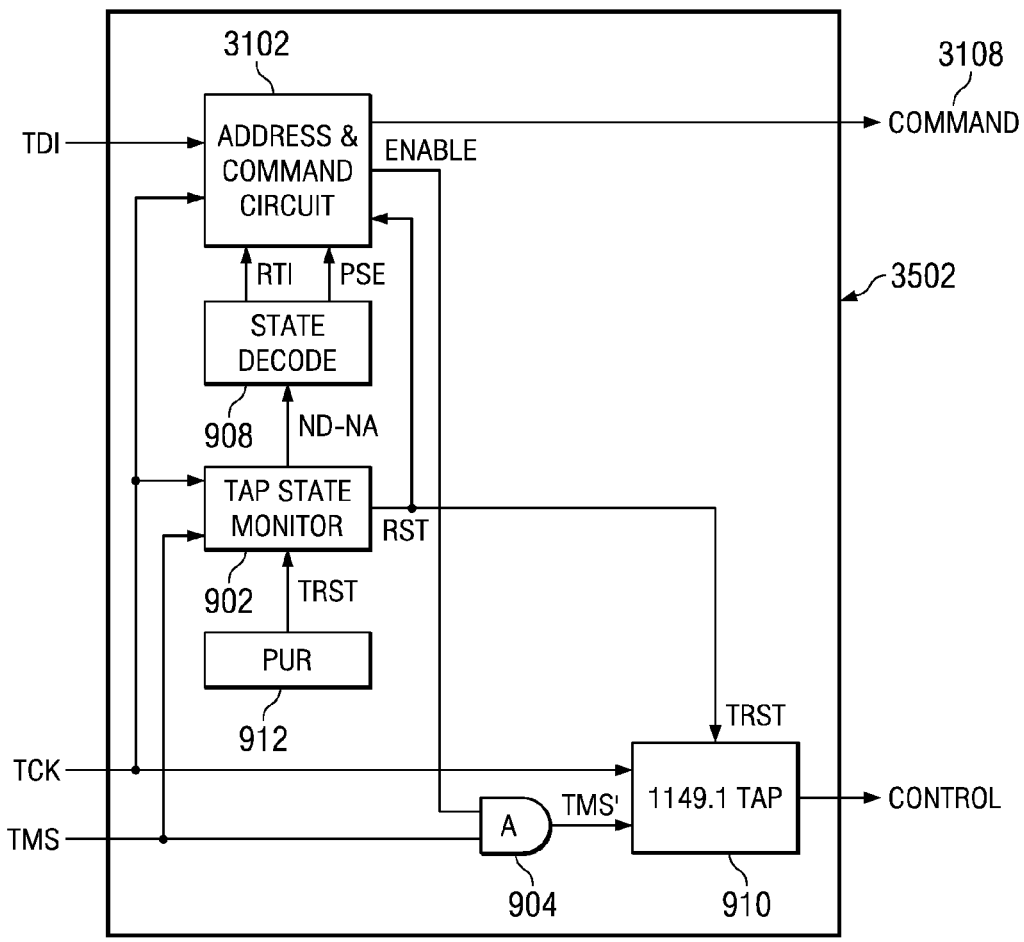
FIG. 34 illustrates a first example implementation of an Addressable & Commandable TAP.

FIG. 34 illustrates an Addressable & Commandable TAP (ACTAP) 3502. The ACTAP 3502 is identical with the ATAP 802 of FIG. 9, with the exception that the Address Circuit 906 of FIG. 9 has been replace by the Address & Command Circuit 3102 of FIG. 31 and the command output bus 3108 from the Address & Command Circuit 3102 is output from the ACTAP 3502. ACTAP 3502 provides for addressing the 1149.1 TAP 910 for access and also provides a command bus for commanding circuits within the device containing ACTAP 3502.

Figure 35:
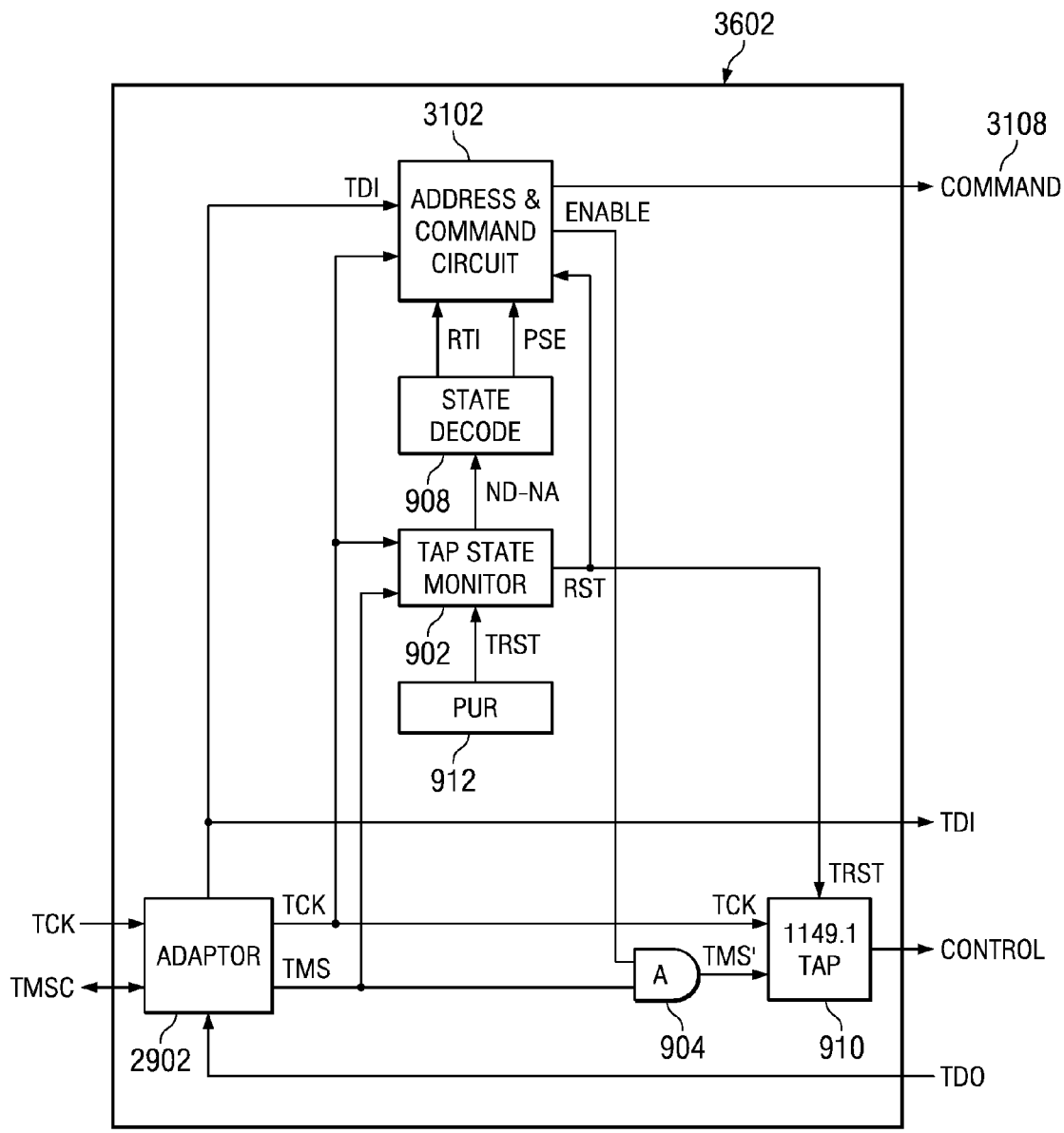
FIG. 35 illustrates a second example implementation of an Addressable & Commandable TAP.

FIG. 35 illustrates an Addressable & Commandable TAP (ACTAP) 3602. The ACTAP 3602 is identical with the ATAP 3002 of FIG. 30, with the exception that the Address Circuit 906 of FIG. 30 has been replace by the Address & Command Circuit 3102 of FIG. 31 and the command output bus 3108 from the Address & Command Circuit 3102 is output from the ACTAP 3602. ACTAP 3602 provides for addressing the 1149.1 TAP 910 for access and also provides a command bus for commanding circuits within the device containing ACTAP 3602.

FIG. 36 illustrates a timing example of inputting an address and command into a device ACTAP 3502/3602 during the transition from Test Logic Reset to Run Test/Idle to Select-DR states. During the Test Logic Reset state the devices ACTAP was disabled by the RST signal and the command bus 3108 was set to the Reset Command. The address input will select the device ACTAP for access. The state transitions occur on the rising edge of TCK 1702. As seen the TDI control bit 1704 and PRS signal 1706 are set high upon entering Run Test/Idle, which initiates the address and command input and update process. The ACTAP remains in the Run Test/Idle state 1708 for the number of CLK (TCK) inputs required to Shift in the address and command bits from the TDI input and Update the command bus 3108. The falling edge 3702 of the last CLK input sets the Enable output from FF 1417 high to enable the device ACTAP and the Update Register 3404 of Command Register 3202. The rising edge 3704 of TCK provides the Update clock input to the Update Register 3404, via And gate 1305, to update the New Command shifted into the ACTAP onto command bus 3108.

FIG. 37 illustrates a timing example of inputting an address and command into a device ACTAP 3502/3602 during the transition from Update-DR/IR to Run Test/Idle to Select-DR states. The address input will select the device ACTAP for access if it was deselected or if the device ACTAP is currently selected, it will keep the device ACTAP selected. The state transitions occur on the rising edge of TCK 1702. As seen the TDI control bit 1704 and PRS signal 1706 are set high upon entering Run Test/Idle, which initiates the address and command input and update process. The ACTAP remains in the Run Test/Idle state 1708 for the number of CLK (TCK) inputs required to Shift in the address and command bits from the TDI input and Update the command bus 3108. The falling edge 3702 of the last CLK input sets the Enable output from FF 1417 high to enable the device ACTAP and the Update Register 3404 of Command Register 3202. The rising edge 3704 of TCK provides the Update clock input to the Update Register 3404, via And gate 1305, to update the New Command shifted into the ACTAP onto command bus 3108.

Figure 38:
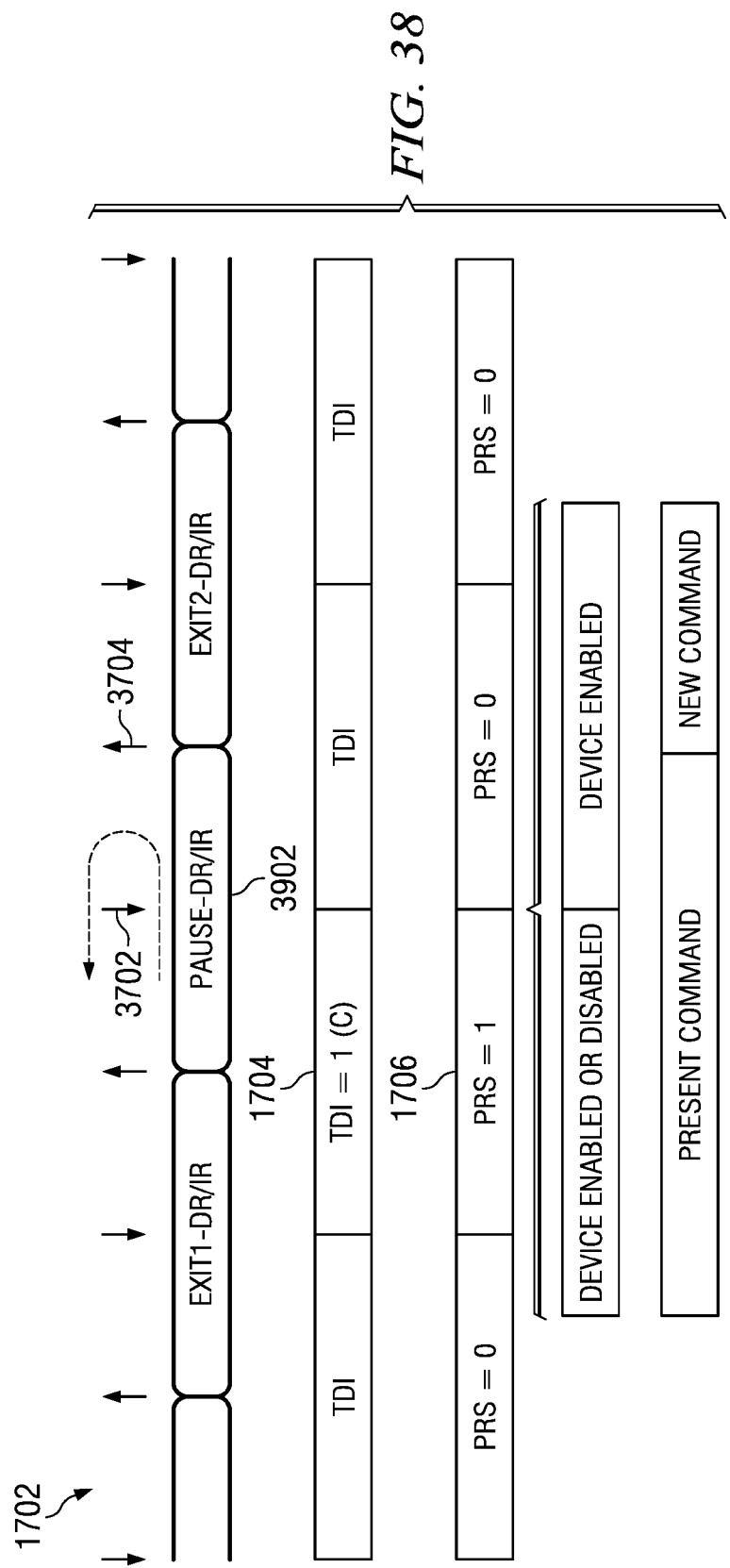
FIG. 38 illustrates an example of inputting an address and command during the Pause-DR or Pause-IR states.

FIG. 38 illustrates a timing example of inputting an address and command into a device ACTAP 3502/3602 during the transition from Exit1-DR/IR to Pause-DR/IR to Exit2-DR/IR states. The address input will select the device ACTAP for access if it was deselected or if the device ACTAP is currently selected, it will keep the device ACTAP selected. The state transitions occur on the rising edge of TCK 1702. As seen the TDI control bit 1704 and PRS signal 1706 are set high upon entering Pause-DR/IR, which initiates the address and command input and update process. The ACTAP remains in the Pause-DR/IR state 3902 for the number of CLK (TCK) inputs required to Shift in the address and command bits from the TDI input and Update the command bus 3108. The falling edge 3702 of the last CLK input sets the Enable output from FF 1417 high to enable the device ACTAP and the Update Register 3404 of Command Register 3202. The rising edge 3704 of TCK provides the Update clock input to the Update Register 3404, via And gate 1305, to update the New Command shifted into the ACTAP onto command bus 3108.

Figure 39:
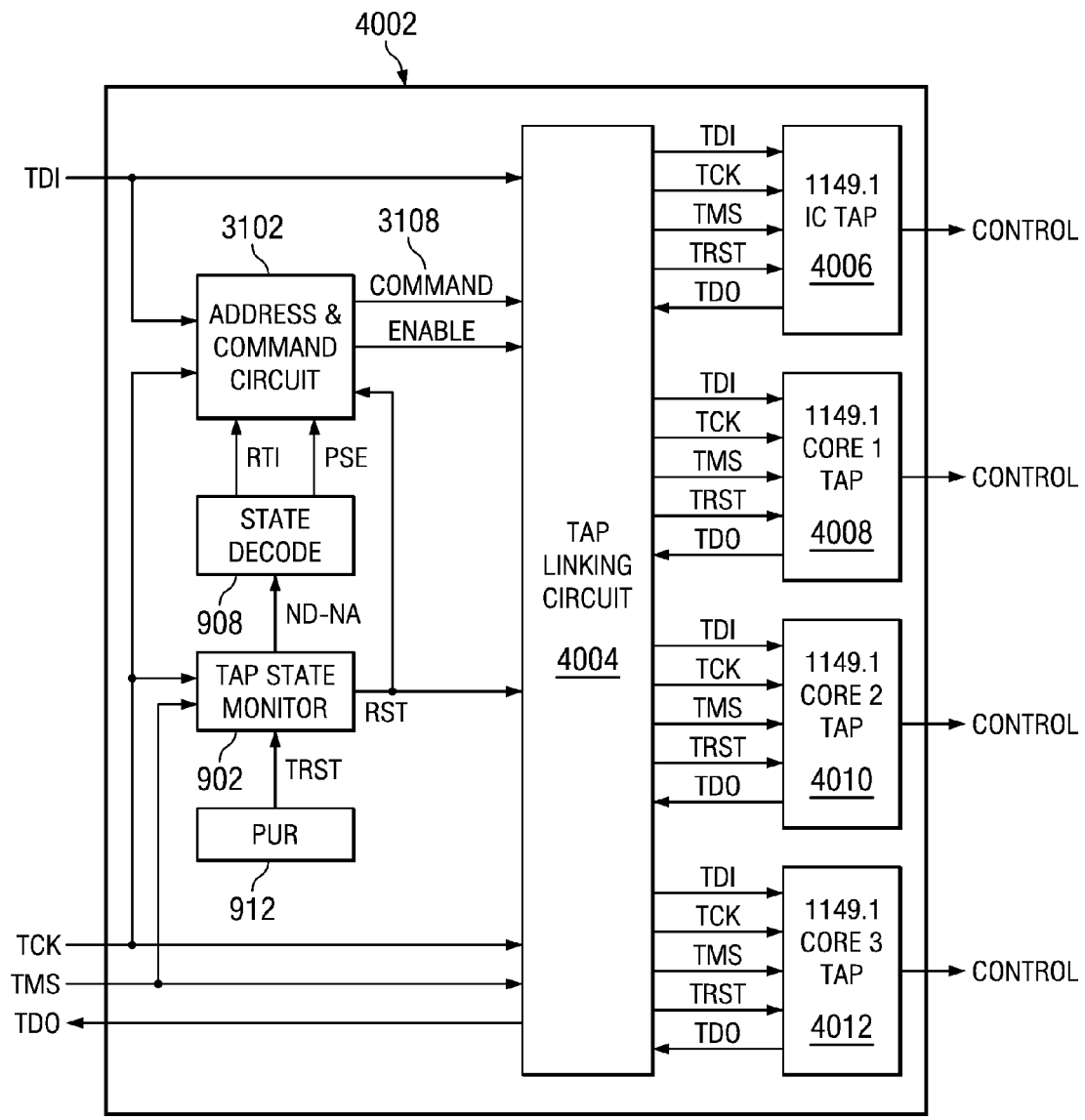
FIG. 39 illustrates a device including an Addressable & Commandable TAP interfaced to a TAP Linking Circuit for selectively accessing plural TAPs.

FIG. 39 illustrates an example of how the command bus 3108 of an Address & Command Circuit 3502 or 3602 could be used to control the selection of one or more 1149.1 TAPs 4006-4012 in a device 4002 using a TAP Linking Circuit 4004. In this example, the Address & Command Circuit 3102 inputs and updates an address and command in the Run Test/Idle, Pause-DR or Pause-IR states as previously described. The TAP Linking Circuit 4004 is coupled to the command bus 3108 and Enable signal outputs from Address & Command Circuit 3102, to the RST output of TAP State Monitor 902, to the devices TDI, TCK, and TMS input leads, and to the devices TDO output lead. The TAP Linking Circuit 4004 is also coupled to the TDI, TCK, TMS, TRST, and TDO signals of each 1149.1 TAP 4006-4012. In this example, TAP 4006 is assumed to be the devices JTAG boundary scan TAP, TAP 4008 is assumed to be a TAP of a first embedded core in the device, TAP 4010 is assumed to be a TAP of a second embedded core in the device, and TAP 4012 is assumed to a TAP of a third embedded core in the device. The TAPs 4006-4012 could be used for any purpose, including but not limited to test, debug, trace, and/or programming purposes.

Figure 40:
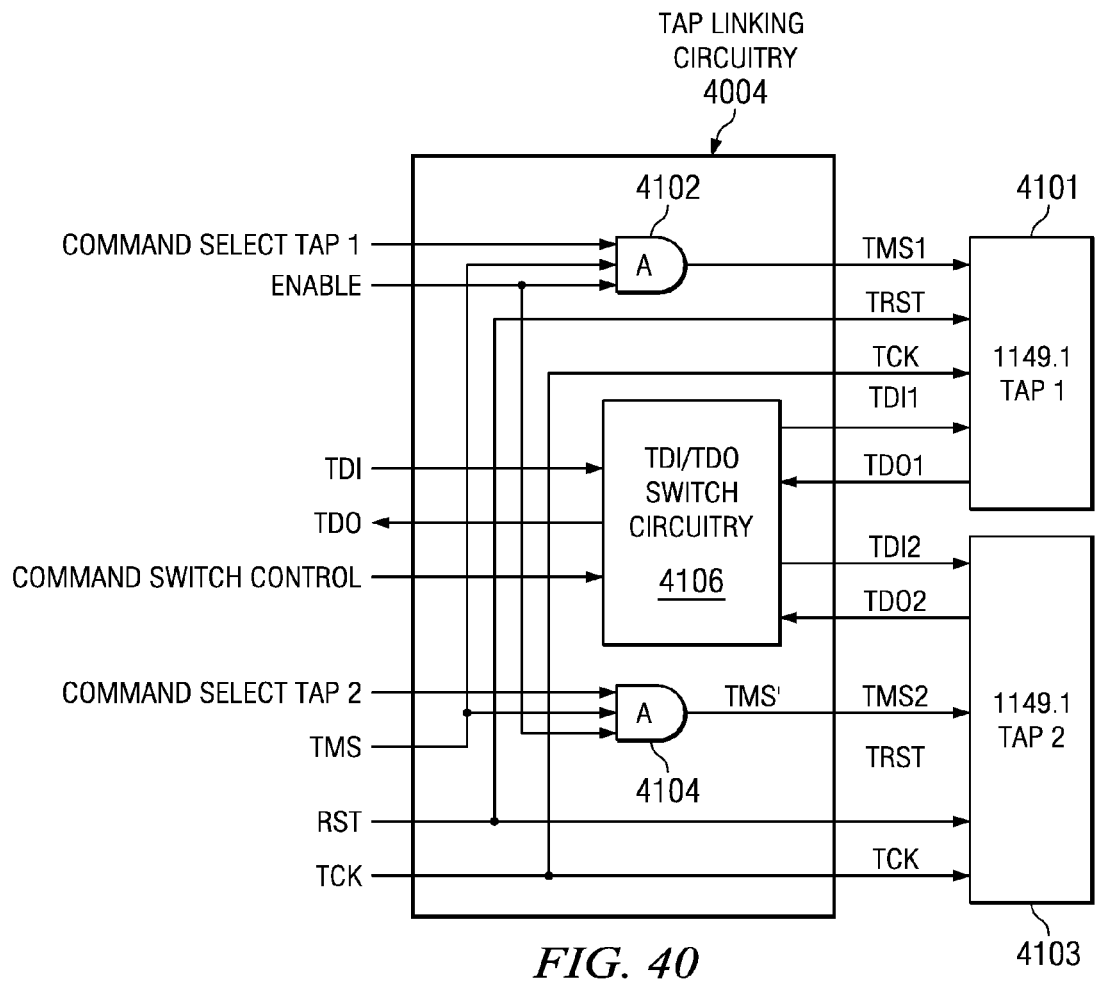
FIG. 40 illustrates an example implementation of the TAP Linking Circuit of FIG. 39.

FIG. 40 illustrates an example implementation of the TAP Linking Circuitry 4004 of FIG. 39 interfaced to only two TAPs 4101-4103 for simplification. As seen the TAP Linking Circuitry 4004 includes And gates 4102-4104 and TDI/TDO Switching Circuitry 4106. And gate 4102 inputs a Command Select TAP 1 signal from command bus 3108, the device TMS signal lead, the Enable signal, and outputs a TMS1 signal to TAP 4101. And gate 4104 inputs a Command Select TAP 2 signal from command bus 3108, the device TMS signal lead, the Enable signal from circuit 3102, and outputs a TMS2 signal to TAP 4103. TDI/TDO Switch Circuitry 4106 inputs the device TDI signal lead, Command Switch Control signals from command bus 3108, a TDO1 signal from TAP 4101, a TDO2 signal from TAP 4103, and outputs a TDI1 signal to TAP 4101 and a TDI2 signal to TAP 4103. TAPs 4101 and 4103 are both coupled to the RST signal from TAP State Monitor 902 and to the devices TCK signal lead. And gates 4102 and 4104 serve the same purpose as previously described for And gate 904, that is to gate on or off a connection between the devices TMS signal lead, or the TMS signal lead from Adaptor 2902, and the TMS input of TAPs 4101-4103. The gating on or off of And gates 4102 and 4104 is controlled by the Enable signal and by the Command Select TAP 1 and 2 signals. The TDI/TDO Switching Circuitry 4106 is controlled by the Command Switch Control signals to couple the devices TDI lead to the TAP 4101 TDI 1 input or to the TAP 4103 TDI 2 input. The TDI/TDO Switching Circuitry 4106 is also controlled by the Command Switch Control signals to couple the devices TDO output lead to the TAP 4101 TDO 1 output or the TAP 4103 TDO 2 output. The TDI/TDO Switching Circuitry can be controlled by the Command Switch Control signals to coupled only a selected one of the TAPs 4101-4103 to the devices TDI and TDO leads, or it can be controlled to link or couple both TAPs 4101-4103 in series, via their TDI and TDO leads, such that both TAPs 4101-4103 can be accessed at the same time via the device TDI and TDO leads. If TAP 4101 is selected it can be accessed via the devices TDI, TCK, TMS, and TDO leads, while TAP 4103 is deselected in the Test Logic Reset, Run Test/Idle, Pause-DR, or Pause-IR states. If TAP 4103 is selected it can be accessed via the devices TDI, TCK, TMS, and TDO leads, while TAP 4101 is deselected in the Test Logic Reset, Run Test/Idle, Pause-DR, or Pause-IR states. If both TAP 4101 and 4103 are selected they can be accessed in series via the devices TDI, TCK, TMS, and TDO leads. At power up or reset of the device, it is advantageous to pre-select the devices 1149.1 JTAG boundary scan TAP 4006 of FIG. 39 to allow the JTAG TAP to be immediately accessible as required in the IEEE 1149.1 standard. This can be achieved by simply defining the command output on command bus 3108 of Address & Command Circuit 3102 to default to selecting the JTAG TAP 4006 of FIG. 39 whenever the device powers up or is reset.

Figure 41:
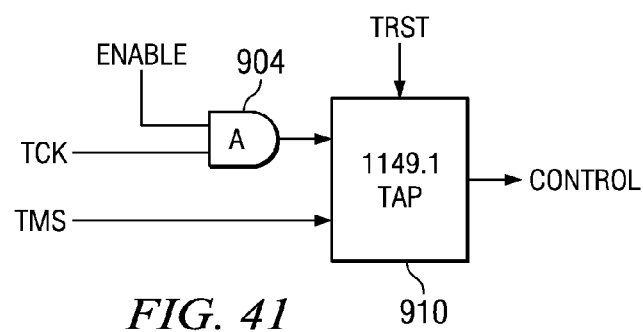
FIG. 41 illustrates an alternative example implementation of how to select or deselect a TAP using a gated TCK signal instead of a gated TMS signal.

It should be understood that while the FIG. 9, FIG. 30, FIG. 34, FIG. 35 and FIG. 40 embodiments of this disclosure have shown gating on and off the TMS signal to select and deselect an 1149.1 TAP 910 using And gate 904, the And gate 904 could have been similarly used to gate on and off the TCK signal to select and deselect an 1149.1 TAP 910 if so desired. This is achieved by simply placing the And gate 904 in the TCK path to TAP 910 instead of in the TMS path to TAP 910 as shown in FIG. 41.

Although the disclosure has been described in detail, it should be understood that various changes, substitutions and alterations may be made without departing from the spirit and scope of the disclosure as defined by the appended claims.

What is claimed is:

1. Addressable test access port circuitry comprising:
(a) test access port circuitry having a TDI input lead, a TMS input lead, a TCK input lead, and a TDO output lead;
(b) test access port control circuitry including state machine circuitry, the control circuitry having a TCK input coupled with the TCK input lead, a TMS input coupled with the TMS input lead, and state outputs indicating Run Test/Idle, Pause-DR and Pause-IR TAP states;
(c) addressing circuitry having a TDI input coupled to the TDI input lead, a TMS input coupled to the TMS input lead, a TCK input coupled to the TCK input lead, and state inputs coupled to the state outputs, the addressing circuitry including:
(i) address control circuitry having a TDI input coupled to the TID input lead, a TCK input coupled to the TCK input lead, a gated state input, and an update output; and
(ii) address detect circuitry having a TDI input coupled to the TDI input lead, a Pause input coupled to the state outputs, a Run Test/Idle input coupled to the state outputs, an update input coupled to the update output, and an enable output; and
(d) gating circuitry having one input connected to the TMS input lead, another input connected to the enable output, and an output connected to the TMS input of the test access port control circuitry.

2. The addressable test access port circuitry of claim 1 in which the state machine circuitry has control outputs representing 16 states.

3. The addressable test access port circuitry of claim 1 in which the state machine circuitry has control outputs representing 16 states, the state machine circuitry transitioning states depending upon the logic level on the TMS input of the control circuit during each rising edge of a clock signal at the TCK input of the control circuit.

4. The addressable test access port circuitry of claim 1 in which the gating circuitry is an AND gate.

* * * * *